(12) United States Patent
Sato

(10) Patent No.: US 12,136,665 B2
(45) Date of Patent: Nov. 5, 2024

(54) SEMICONDUCTOR DEVICE AND POWER CONVERSION DEVICE

(71) Applicant: Mitsubishi Electric Corporation, Tokyo (JP)

(72) Inventor: Katsumi Sato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 212 days.

(21) Appl. No.: 17/933,745

(22) Filed: Sep. 20, 2022

(65) Prior Publication Data

US 2023/0155015 A1    May 18, 2023

(30) Foreign Application Priority Data

Nov. 18, 2021    (JP) ................................ 2021-187817

(51) Int. Cl.
*H01L 29/73*    (2006.01)
*H01L 29/739*   (2006.01)
(Continued)

(52) U.S. Cl.
CPC ........ *H01L 29/7397* (2013.01); *H01L 29/861* (2013.01); *H02M 7/53871* (2013.01)

(58) Field of Classification Search
CPC ........... H02M 7/53871; H01L 29/7397; H01L 29/861
See application file for complete search history.

(56) References Cited

U.S. PATENT DOCUMENTS

2011/0297934 A1    12/2011   Soeno
2015/0015309 A1    1/2015    Werber
(Continued)

FOREIGN PATENT DOCUMENTS

JP    2009-099690 A    5/2009
JP    2010-192565 A    9/2010
(Continued)

OTHER PUBLICATIONS

An Office Action; "Notice of Reasons for Refusal," mailed by the Japanese Patent Office on Jul. 30, 2024, which corresponds to Japanese Patent Application No. 2021-187817 and is related to U.S. Appl. No. 17/933,745; with English language translation.

*Primary Examiner* — Jue Zhang
*Assistant Examiner* — Lakaisha Jackson
(74) *Attorney, Agent, or Firm* — Studebaker & Brackett PC

(57) ABSTRACT

Provided is a semiconductor device that carries current in both directions and that enables accurate detection of current flowing through the semiconductor device. The semiconductor device includes a transistor and a diode both formed in a common semiconductor base body. The semiconductor device includes: a first main surface; a second main surface; a first electrode; a second electrode; a third electrode for current sensing; and a fourth electrode for current sensing. The semiconductor base body includes: a transistor region in which the transistor is formed; a diode region in which the diode is formed; and a separation region formed between the transistor region and the diode region. The third electrode is provided on the first main surface in the transistor region at a distance from the first electrode. The fourth electrode is provided on the first main surface in the diode region at a distance from the first electrode.

26 Claims, 12 Drawing Sheets

(51) Int. Cl.
*H01L 29/861* (2006.01)
*H02M 7/5387* (2007.01)

(56) References Cited

U.S. PATENT DOCUMENTS

| | | | |
|---|---|---|---|
| 2020/0161460 A1* | 5/2020 | Harada | H01L 29/1004 |
| 2020/0312995 A1* | 10/2020 | Nagahisa | H01L 29/0696 |
| 2021/0399144 A1* | 12/2021 | Ebihara | H01L 29/66712 |
| 2023/0139229 A1 | 5/2023 | Kawahara et al. | |
| 2024/0204056 A1* | 6/2024 | Tominaga | H01L 29/0696 |

FOREIGN PATENT DOCUMENTS

| | | |
|---|---|---|
| JP | 2010-192597 A | 9/2010 |
| JP | 2015-019370 A | 1/2015 |
| JP | 6962511 B1 | 11/2021 |

* cited by examiner

FIG. 8

| OPERATING MODE | COLLECTOR VOLTAGE [WHEN THE EMITTER ELECTRODE IS GROUNDED] | FIRST GATE VOLTAGE | SECOND GATE VOLTAGE | ASPECT [ASPECT OF LEAK CURRENT AND BREAKDOWN OF JUNCTION ARE NOT TAKEN INTO ACCOUNT] |
|---|---|---|---|---|
| 1 | POSITIVE COLLECTOR VOLTAGE IS APPLIED | NOT APPLIED | NOT APPLIED | CURRENT IS CUT OFF |
| 2 | POSITIVE COLLECTOR VOLTAGE IS APPLIED | APPLIED | NOT APPLIED | FORWARD CURRENT IS CONDUCTED |
| 3 | POSITIVE COLLECTOR VOLTAGE IS APPLIED | APPLIED | APPLIED | FORWARD CURRENT IS CONDUCTED |
| 4 | POSITIVE COLLECTOR VOLTAGE IS APPLIED | NOT APPLIED | APPLIED | CURRENT IS CUT OFF |
| 5 | NEGATIVE COLLECTOR VOLTAGE IS APPLIED | NOT APPLIED | NOT APPLIED | CURRENT IS CUT OFF |
| 6 | NEGATIVE COLLECTOR VOLTAGE IS APPLIED | APPLIED | NOT APPLIED | CURRENT IS CUT OFF |
| 7 | NEGATIVE COLLECTOR VOLTAGE IS APPLIED | APPLIED | APPLIED | REVERSE CURRENT IS CONDUCTED |
| 8 | NEGATIVE COLLECTOR VOLTAGE IS APPLIED | NOT APPLIED | APPLIED | REVERSE CURRENT IS CONDUCTED |

SEMICONDUCTOR DEVICE AND POWER CONVERSION DEVICE

BACKGROUND OF THE INVENTION

Field of the Invention

The present disclosure relates to a semiconductor device and a power conversion device.

Description of the Background Art

Japanese Patent Application Laid-Open No. 2009-99690 discloses a Reverse-Conducting Insulated Gate Bipolar Transistor (RC-IGBT), a semiconductor device that can carry current in both directions.

In conventional RC-IGBT, it is difficult to accurately detect current, since the forward current-forward voltage characteristics of the free wheeling diode (FWD) element changes depending on the presence or absence of a gate signal, whereas the forward current-forward voltage characteristics of the FWD sense element does not change much depending on the presence or absence of a gate signal.

SUMMARY

The present disclosure has an object to provide a semiconductor device that carries current in both directions and that enables accurate detection of current flowing through the semiconductor device.

A semiconductor device according to one aspect of the present disclosure includes a transistor and a diode both formed in a common semiconductor base body. The semiconductor device includes: a first electrode; a second electrode; a third electrode for current sensing; a fourth electrode for current sensing; and at least one first gate electrode. The semiconductor base body includes: a first main surface and a second main surface as one main surface and the other main surface, respectively; a transistor region in which the transistor is formed; a diode region in which the diode is formed; and a separation region formed between the transistor region and the diode region. The transistor region includes: a first semiconductor layer of a first conductivity type; an eighth semiconductor layer of the first conductivity type provided on the second main surface side of the first semiconductor layer and having a first conductivity type impurity concentration higher than that of the first semiconductor layer; a second semiconductor layer of a second conductivity type provided on the second main surface side of the eighth semiconductor layer; a third semiconductor layer of the second conductivity type provided on the first main surface side of the first semiconductor layer; and at least one fourth semiconductor layer selectively provided on the first main surface side of the third semiconductor layer. The diode region includes: the first semiconductor layer; the eighth semiconductor layer provided on the second main surface side of the first semiconductor layer; a fifth semiconductor layer of the first conductivity type having a first conductivity type impurity concentration higher than that of the first semiconductor layer and provided on the second main surface side of the eighth semiconductor layer; and a sixth semiconductor layer of the second conductivity type provided on the first main surface side of the first semiconductor layer. The first electrode is provided on the first main surface in the transistor region and in the diode region. The second electrode is provided on the second main surface in the transistor region and in the diode region. The third electrode is provided on the first main surface in the transistor region of the semiconductor base body at a distance from the first electrode. The fourth electrode is provided on the first main surface in the diode region of the semiconductor base body at a distance from the first electrode. The third semiconductor layer and the at least one fourth semiconductor layer are electrically connected to the first electrode in the first main surface in the transistor region. The third semiconductor layer and the at least one fourth semiconductor layer are electrically connected to the third electrode in the first main surface in the transistor region. The second semiconductor layer is electrically connected to the second electrode in the second main surface in the transistor region. The at least one first gate electrode faces the first semiconductor layer, the third semiconductor layer, and the at least one fourth semiconductor layer via at least one first insulating film in the transistor region. The sixth semiconductor layer is electrically connected to the first electrode in the first main surface in the diode region. The sixth semiconductor layer is connected to the fourth electrode in the first main surface in the diode region. The fifth semiconductor layer is connected to the second electrode in the second main surface in the diode region.

According to the present disclosure, a semiconductor device that carries current in both directions and that enables accurate detection of current flowing through the semiconductor device is provided.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 8 is a diagram showing operating modes of a semiconductor device according to the third embodiment.

DESCRIPTION OF THE PREFERRED EMBODIMENTS

In the following description, n and p types denote conductivity types of semiconductors. A first conductivity type and a second conductivity type will be taken as the n type and the p type, respectively, in the present disclosure, but may be taken as the p type and the n type, respectively. Also, an n⁻ type indicates that the impurity concentration thereof is lower than that of the n type, and an n⁺ type indicates that the impurity concentration thereof is higher than that of the n type. Similarly, a p⁻ type indicates that the impurity concentration thereof is lower than that of the p type, and a p⁺ type indicates that the impurity concentration thereof is higher than that of the p type.

A. First Embodiment

<A-1. Configuration>

Figure 1:
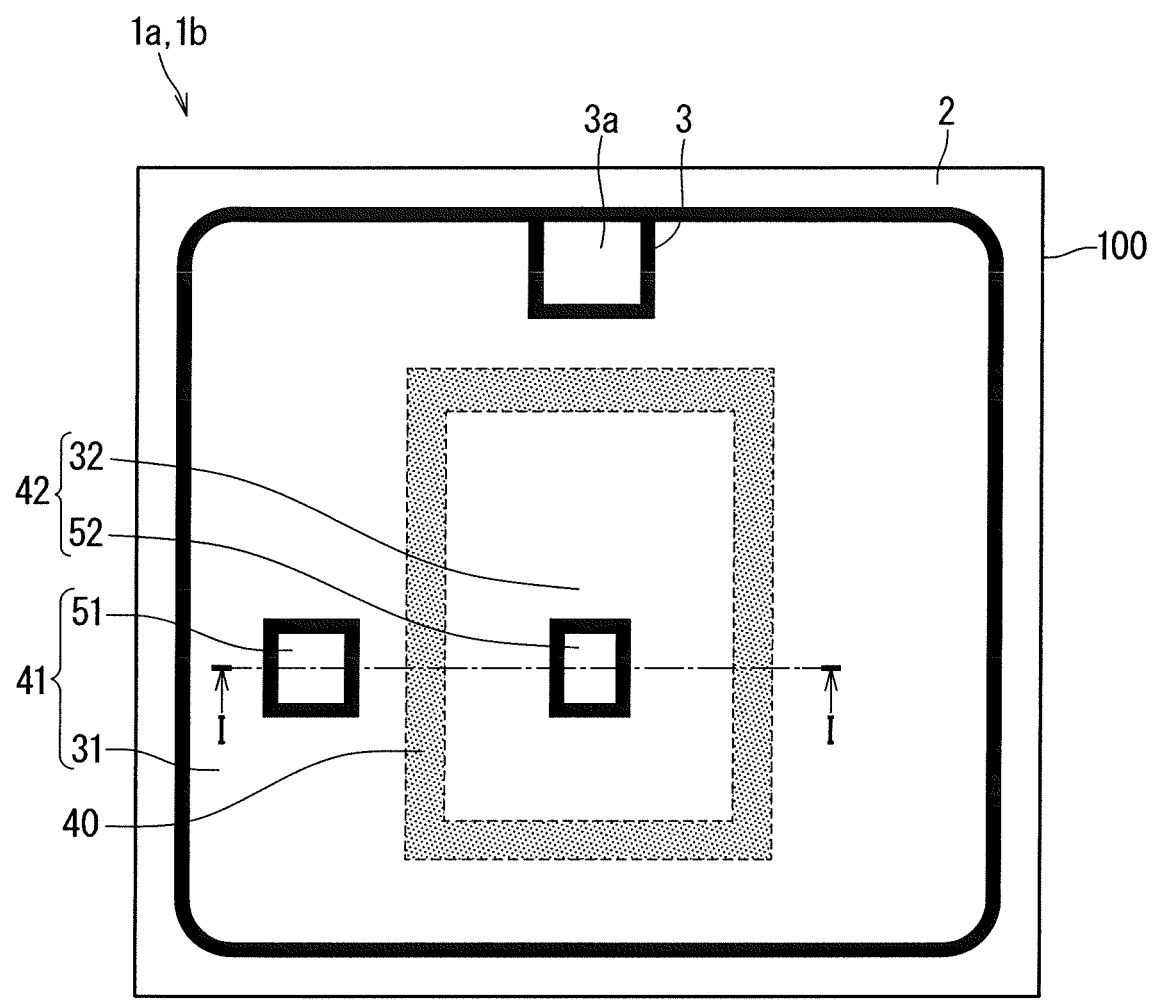
FIG. 1 is a plan view showing a schematic configuration of a semiconductor device according to the first embodiment.

FIG. 1 is a plan view showing a schematic configuration of a semiconductor device 1a according to the first embodiment.

Figure 2:
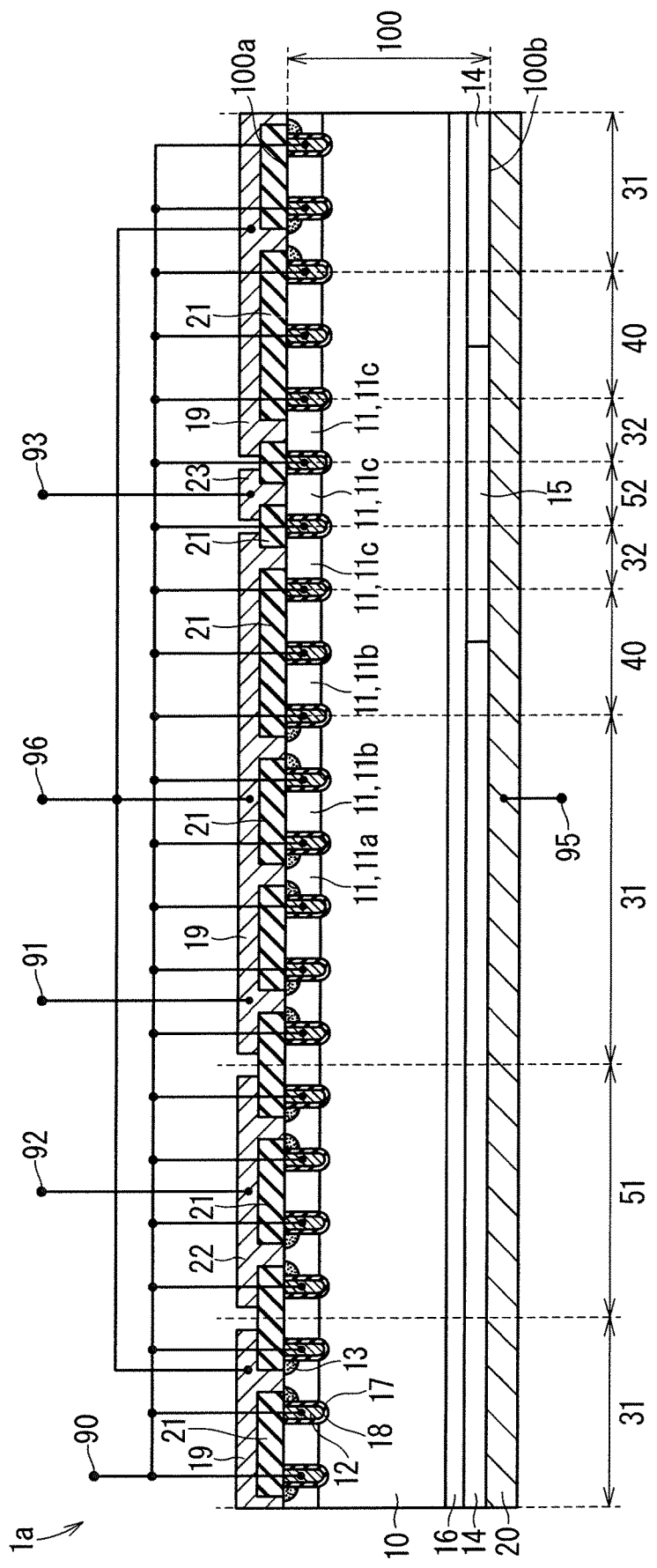
FIG. 2 is a cross-sectional view of a semiconductor device according to the first embodiment.

FIG. 2 is a cross-sectional view along a line I-I in FIG. 1 in the semiconductor device 1a.

The semiconductor device 1a is a semiconductor device which works as an RC-IGBT.

The semiconductor device 1a is, for example, used as a power switching element used in an inverter module for motor control.

The semiconductor device 1a includes: a semiconductor base body 100; an electrode 19; an electrode 20; an electrode 22; an electrode 23; and an insulating film 21.

The electrode 19, the electrode 20, the electrode 22, and the electrode 23 are formed by using aluminum-based material, for example.

As shown in FIG. 1, the semiconductor base body 100 includes: an IGBT region 41 in which an IGBT is formed; a diode region 42 in which a diode is formed; a separation region 40 formed between the IGBT region 41 and the diode region 42; a pad region 3; and a termination region 2.

As shown in FIG. 2, the semiconductor base body 100 has a first main surface 100a and a second main surface 100b as one main surface and the other main surface.

The thickness of the semiconductor base body 100, namely the distance between the first main surface 100a and the second main surface 100b, is about 120 μm, for example.

The IGBT region 41 and the diode region 42 are separated from each other by the separation region 40.

The IGBT region 41 includes an IGBT main region 31 and an IGBT sense region 51.

The diode region 42 includes a diode main region 32 and a diode sense region 52.

A gate pad 3a is provided on the first main surface 100a of the semiconductor base body 100 in the pad region 3. The gate pad 3a is formed by using aluminum-based material, for example. The gate pad 3a is electrically separated from the electrode 19 and the electrode 22. The gate pad 3a is electrically connected to a gate electrode 12 described below. The IGBT formed in the IGBT region 41 can be controlled by inputting a drive signal to the gate pad from the outside.

The termination region 2 is a region provided in the outer periphery portion of the semiconductor base body 100. The termination region 2 is provided such that the termination region 2 surrounds the combined region of the IGBT region 41, the diode region 42, and the separation region 40, and the gate pad region 3. In the termination region 2, a termination structure is formed in the first main surface 100a side surface layer of the semiconductor base body 100 to suppress electric field concentration.

The semiconductor device 1a is manufactured by using an n⁻ type single crystal bulk silicon substrate with impurity concentration of about $1 \times 10^{14}$ cm$^{-3}$, for example. The single crystal bulk silicon substrate is a substrate manufactured by the floating zone (FZ) method, for example. The single crystal bulk silicon substrate corresponds to the semiconductor base body 100.

<A-1-1. Structure of IGBT Region>

The IGBT region 41 includes the IGBT main region 31 and the IGBT sense region 51. The IGBT main region 31 and the IGBT sense region 51 are adjacent to each other. The IGBT sense region 51 is surrounded by the IGBT main region 31 in the plan view, for example.

The IGBT main region 31 and the IGBT sense region 51 share the electrode 20. On the other hand, the electrode 19, which is provided on the first main surface 100a of the IGBT main region 31, and the electrode 22, which is provided on the first main surface 100a of the IGBT sense region 51, are separated from each other.

The area of the IGBT sense region 51 in plan view is smaller than the area of the IGBT main region 31 in plan view. In plan view, the area of the IGBT sense region 51 is more than or equal to 1/3000 times and less than or equal to 1/300 times the area of the IGBT main region 31, for example. In plan view, the area of the IGBT sense region 51 is about 1/1000 times the area of the IGBT main region 31, for example.

The IGBT main region 31 and the IGBT sense region 51 have similar structures except for the difference in size in plan view. The structures of the IGBT main region 31 and the IGBT sense region 51 are described below as the structure of the IGBT region 41.

In the IGBT region 41, the semiconductor base body 100 includes: an n⁻ type drift layer 10; an n type buffer layer 16; a p⁺ type collector layer 14; a p type base layer 11; and n⁺ type emitter layers 13.

The base layer 11 is provided on the first main surface 100a side of the drift layer 10.

The emitter layers 13 are selectively provided on the first main surface 100a side of the base layer 11.

Trenches 17 extending from the first main surface 100a through the emitter layers 13 and the base layer 11 to the drift layer 10 are provided in the semiconductor base body 100. In each of the trenches 17, a gate electrode 12 is provided via a gate insulating film 18 provided on the side surface and bottom surface of the trench 17. The gate electrodes 12 are, for example, formed by using polysilicon with impurity concentration of about $1 \times 10^{20}$ cm$^{-3}$. The trenches 17 are, for example, provided such that they extend in one of in-plane directions.

The gate electrodes 12 face the emitter layers 13, the base layer 11, and the drift layer 10 via the gate insulating films 18.

In the IGBT region 41, the base layer 11 includes base layers 11a and base layers 11b.

A base layer 11a is a mesa shape region of the plurality of mesa shape regions formed by dividing the base layer 11 by the trenches 17 and is a mesa shape region where the emitter layers 13 are selectively formed in the first main surface 100a side surface layer thereof. A base layer 11b is a mesa shape region of the plurality of mesa shape regions formed by dividing the base layer 11 by the trenches 17 and is a mesa shape region where the emitter layers 13 are not formed in the first main surface 100a side surface layer thereof. The base layers 11a and the base layers 11b are, for example, placed alternately along the direction intersecting the extending direction of the trenches 17.

In the present embodiment, the thickness of the emitter layers 13 is, for example, about 0.5 μm, and the impurity concentration of the emitter layers 13 is, for example, about $3\times10^{19}$ cm$^{-3}$.

In the IGBT main region 31, the electrode 19 is provided on the first main surface 100a.

In the IGBT sense region 51, the electrode 22 is provided on the first main surface 100a.

In the IGBT main region 31 and the IGBT sense region 51, the electrode 20 is provided on the second main surface 100b.

The emitter layers 13 and the base layers 11a are electrically connected to the electrode 19 in the first main surface 100a. The electrode 19 works as an emitter electrode of the IGBT element formed in the IGBT region 41.

The regions of the base layers 11a which face the gate electrodes 12 works as channel regions of the IGBT element formed in the IGBT region 41.

Most of the first main surface 100a side surface of the base layers 11b is covered by the insulating film 21. Only part of the first main surface 100a side surface of the base layers 11b which is not covered by the insulating film 21 is connected to the electrode 19. The area of the part where the base layers 11b and the electrode 19 are connected is small, and the electrical resistance of the path which passes through the part where the base layers 11b and the electrode 19 are connected is high. The region where the base layers 11b and the electrode 19 are connected is not shown in the figures.

The buffer layer 16 is provided on the second main surface 100b side of the drift layer 10.

The buffer layer 16 is for suppressing the extension of the depletion layer which extends from the pn junction of the border between the drift layer 10 and the base layer 11.

The collector layer 14 is provided on the second main surface 100b side of the buffer layer 16. The thickness of the collector layer 14 is, for example, about 0.5 μm, and the impurity concentration of the collector layer 14 is, for example, about $1\times10^{18}$ cm$^{-3}$.

In the IGBT main region 31, the base layers 11a and the emitter layers 13 are electrically connected to the electrode 19 in the first main surface 100a.

In the IGBT sense region 51, the base layers 11a and the emitter layers 13 are electrically connected to the electrode 22 in the first main surface 100a.

In the IGBT main region 31 and the IGBT sense region 51, the collector layer 14 is electrically connected to the electrode 20 in the second main surface 100b.

<A-1-2. Diode Region>

The diode region 42 includes the diode main region 32 and the diode sense region 52. The diode main region 32 and the diode sense region 52 are adjacent to each other. The diode sense region 52 is surrounded by the diode main region 32 in the plan view, for example.

The diode main region 32 and the diode sense region 52 share the electrode 20. On the other hand, the electrode 19, which is provided on the first main surface 100a of the diode main region 32, and the electrode 23, which is provided on the first main surface 100a of the diode sense region 52, are separated from each other.

The area of the diode sense region 52 in plan view is smaller than the area of the diode main region 32 in plan view. In plan view, the area of the diode sense region 52 is more than or equal to 1/3000 times and less than or equal to 1/300 times the area of the diode main region 32, for example. In plan view, the area of the diode sense region 52 is about 1/1000 times the area of the diode main region 32, for example.

The diode main region 32 and the diode sense region 52 have similar structures except for the difference in size in plan view. The structures of the diode main region 32 and the diode sense region 52 are described below as the structure of the diode region 42.

In the diode region 42, the semiconductor base body 100 includes: the n$^-$ type drift layer 10; the n type buffer layer 16; an n$^+$ type cathode layer 15; and the p type base layer 11.

The base layer 11 includes anode layers 11c in the diode region 42. The anode layers 11c have a similar structure to that of the base layers 11b in the IGBT region 41.

The drift layer 10 in the diode region 42, the drift layer 10 in the IGBT region 41, and the drift layer 10 in the separation region 40 are connected and formed integrally.

In the diode region 42, the buffer layer 16 is provided on the second main surface 100b side of the drift layer 10.

Figure 15:
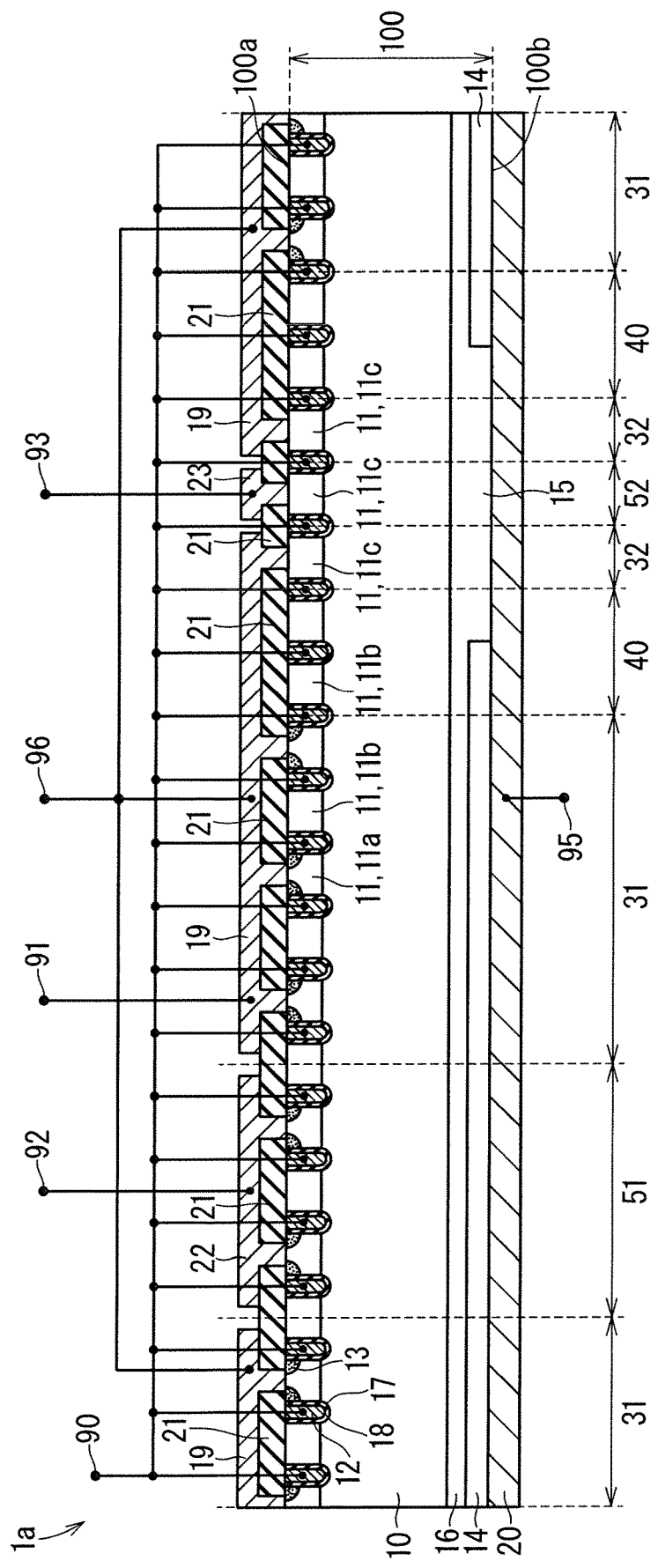
FIG. 15 is a cross-sectional view of a semiconductor device according to the first embodiment.

In the diode region 42, the cathode layer 15 is provided on the second main surface 100b side of the buffer layer 16. The thickness of the cathode layer 15 is, for example, about 0.5 μm. The impurity concentration of the cathode layer 15 is, for example, about $1\times10^{18}$ cm$^{-3}$. The buffer layer 16 and the cathode layer 15 may be integrally formed as shown in FIG. 15. In other words, an n type or n$^+$ type integral semiconductor layer may be provided in the region where the buffer layer 16 and the cathode layer 15 are combined. The integral semiconductor layer may be formed by single ion implantation process. The impurity concentration of the integral semiconductor layer is, for example, about $1\times10^{18}$ cm$^{-3}$.

In the diode main region 32, the electrode 19 is provided on the first main surface 100a.

The electrode 19 is common to IGBT main region 31 and diode main region 32. In the diode sense region 52, the electrode 23 is provided on the first main surface 100a.

In the diode main region 32 and the diode sense region 52, the electrode 20 is provided on the second main surface 100b. The electrode 20 is common to diode region 42 and the IGBT region 41.

In the diode main region 32, the anode layers 11c are electrically connected to the electrode 19 in the first main surface 100a. The electrode 19 works as an anode electrode of the diode formed in the diode region 42.

In the diode sense region 52, the anode layers 11c are connected to the electrode 23 in the first main surface 100a.

In the diode main region 32 and the diode sense region 52, the cathode layer 15 is electrically connected to the electrode 20 in the second main surface 100b.

<A-1-3. Separation Region>

The semiconductor base body 100 includes the separation region 40 provided between the IGBT region 41 and the diode region 42. The IGBT region 41 and the diode region 42 are separated from each other by the separation region 40.

Separation of the IGBT region 41 and the diode region 42 by the separation region 40 increases electrical resistance between the IGBT region 41 and the diode region 42. Thereby functional interference between the IGBT and the diode due to the integral formation of the IGBT and the diode are suppressed.

The width of the separation region 40 is, for example, more than or equal to 3 times the thickness of the semiconductor base body 100. The width of the separation region 40 is, for example, about 5 times the thickness of the semiconductor base body 100. In the present embodiment, the thickness of the semiconductor base body 100 is, for example, about 120 μm, and the width of the separation region 40 is, for example, about 600 μm.

Due to the presence of the separation region 40, the IGBT region 41 and the diode region 42 are separated by, for example, three times the thickness of the semiconductor base body 100 or more. Due to the presence of the separation region 40, the IGBT region 41 and the diode region 42 are separated by, for example, about five times the thickness of the semiconductor base body 100. Due to the presence of the separation region 40, the IGBT region 41 and the diode region 42 are separated by, for example, about 600 μm.

In the separation region 40, the semiconductor base body 100 includes: the n⁻ type drift layer 10; the n type buffer layer 16; the p⁺ type collector layer 14; the p type base layer 11*b*; and the n⁺ type cathode layer 15.

In the separation region 40, the base layers 11*b* is provided on the first main surface 100*a* side of the drift layer 10. The base layers 11*b* in the separation region 40 have similar structure to that of the base layers 11*b* in the IGBT region 41. The insulating film 21 is provided between the base layer 11*b* and the electrode 19 in the separation region 40, and the base layer 11*b* and the electrode 19 are not in contact with each other in the separation region 40, for example.

In the separation region 40, the buffer layer 16 is provided on the second main surface 100*b* side of the drift layer 10.

In the separation region 40, the collector layer 14 is selectively provided on the second main surface 100*b* side of the buffer layer 16.

In the separation region 40, the cathode layer 15 is selectively provided on the second main surface 100*b* side of the buffer layer 16.

The collector layer 14 provided in the IGBT region 41 protrudes into the separation region 40. The cathode layer 15 provided in the diode region 42 protrudes into the separation region 40. Namely, the border between the collector layer 14 and the cathode layer 15 is at least partially included in the separation region 40 in the plan view. The cathode layer 15 is provided in the region which includes the whole of the diode region 42 in plan view, for example. The border between the collector layer 14 and the cathode layer 15 is completely included in the separation region 40, for example.

In a case where the border between the collector layer 14 and the cathode layer 15 protrudes into the diode region 42, size of the cathode layer 15 becomes smaller, and forward voltage of the diode formed in the diode region 42 becomes higher. In a case where the border between the collector layer 14 and the cathode layer 15 protrudes into the IGBT region 41, suppression of functional interference between the IGBT formed in the IGBT region 41 and the diode formed in the diode region 42 becomes insufficient.

The border between the collector layer 14 and the cathode layer 15 is placed in the separation region 40, thus electrical resistance between the cathode layer 15 and the IGBT main region 31 is increased since distance between the cathode layer 15 and the IGBT main region 31 is ensured, and the functional interference between the IGBT region 41 and the diode region 42 can be suppressed.

In a case where the separation region 40 is not provided, when ON voltage is applied to the gate electrodes 12 and the channel in the IGBT region 41 becomes ON while forward current of the diode, namely current from the electrode 19 to the electrode 20, is flowing in the diode region 42, electric potential of the anode layers 11*c* and of the drift layer 10 become closer with each other in a region of the diode region 42 which is close to the IGBT region 41 and which is not functionally separated from the IGBT region 41 by the sufficiently large electrical resistance. In other words, by the ON voltage applied to the gate electrodes 12, part of the diode region 42 becomes difficult to operate in forward direction. As a result, there are problems that forward voltage Vf of the diode region 42 increases and forward loss of the diode region 42 increases. Since the part of the diode region 42 becomes difficult to operate in forward direction, ratio of current in the diode main region 32 to current in the diode sense region 52 varies depending on whether the gate voltage applied to the gate electrodes 12 is ON voltage or OFF voltage. In other words, there is a problem that current flowing through the diode main region 32 cannot be detected accurately by the diode sense region 52. In the semiconductor device 1*a* of present embodiment, since the separation region 40 is provided, these problems are suppressed, and current flowing through the diode main region 32 can be detected accurately by the diode sense region 52.

Since the separation region 40 is provided, a path of current from the electrode 19 in the IGBT region 41 to the electrode 20 in the diode region 42, namely a path from the electrode 19 through the base layers 11*a*, the drift layer 10, the buffer layer 16, and the cathode layer 15 to the electrode 20, is highly resistive, and the path is not an effective current path. Although the electrical resistance of the path varies depending on whether a gate signal applied to the gate electrodes 12 is an ON signal or OFF signal and operation of the diode main region 32 is affected by the variation of the electrical resistance of the path, since the path is highly resistive, the effect of whether the gate signal applied to the gate electrodes 12 is an ON signal or OFF signal on the operation of the diode main region 32 is suppressed. Further, since only the collector layer 14 is in contact with the electrode 20 in the IGBT main region 31 and since there is a pn junction between the drift layer 10 and the collector 14, current hardly flow in the direction from the electrode 19 to the electrode 20 in the IGBT main region 31. As a result, the effect of whether the gate signal applied to the gate electrodes 12 is an ON signal or OFF signal and the effect of the operation of the IGBT main region 31 on the operation of the diode main region 32 is suppressed.

As described above, in the present embodiment, since the separation region 40 is provided, the effect of whether the gate signal applied to the gate electrodes 12 is an ON signal or OFF signal on the forward current-forward voltage characteristics of the diode main region 32 is suppressed, and current flowing through the diode main region 32 can be detected accurately by the diode sense region 52. Sufficiently wide width of the separation region 40 further ensures these effects.

<A-2. Operation>

The semiconductor device 1*a* is, for example, built into a case after the electrode 20 is solder bonded to the metal film on the external insulated substrate (not shown in the figures). The case is a case, for example, with an emitter terminal 96, an emitter sense terminal 91, a collector terminal 95, a gate terminal 90, an IGBT sense terminal 92, a diode sense terminal 93, and the like attached.

After that, the electrode 19 and the emitter terminal 96, the electrode 19 and the emitter sense terminal 91, the metal film on which the electrode 20 are solder bonded and the collector terminal 95, the gate pad 3*a* and the gate terminal 90, the electrode 22 and the IGBT sense terminal 92, and the electrode 23 and the diode sense terminal 93, are electrically connected by the bonding with aluminum wire or the like. In FIG. 2, these electrical connections are schematically shown.

In the semiconductor device 1a, both of the electrode 22 for sensing and the electrode 23 for sensing are on the first main surface 100a side. Accordingly, bonding of the electrode 22 and the IGBT sense terminal 92, and the bonding of the electrode 23 and the diode sense terminal 93 can be done simultaneously during the wire bonding process for connecting the electrode 19 and the emitter sense terminal 91, and the increase of the number of assembly processes can be suppressed.

After that, packaging of the semiconductor device 1a is completed through the coverage of the semiconductor device 1a and the aluminum wire by the resin such as silicone gel, and the attachment of the lid to the case.

Below, an operation of a feedback circuit 150 using the semiconductor device 1a thus packaged is described.

Figure 3:
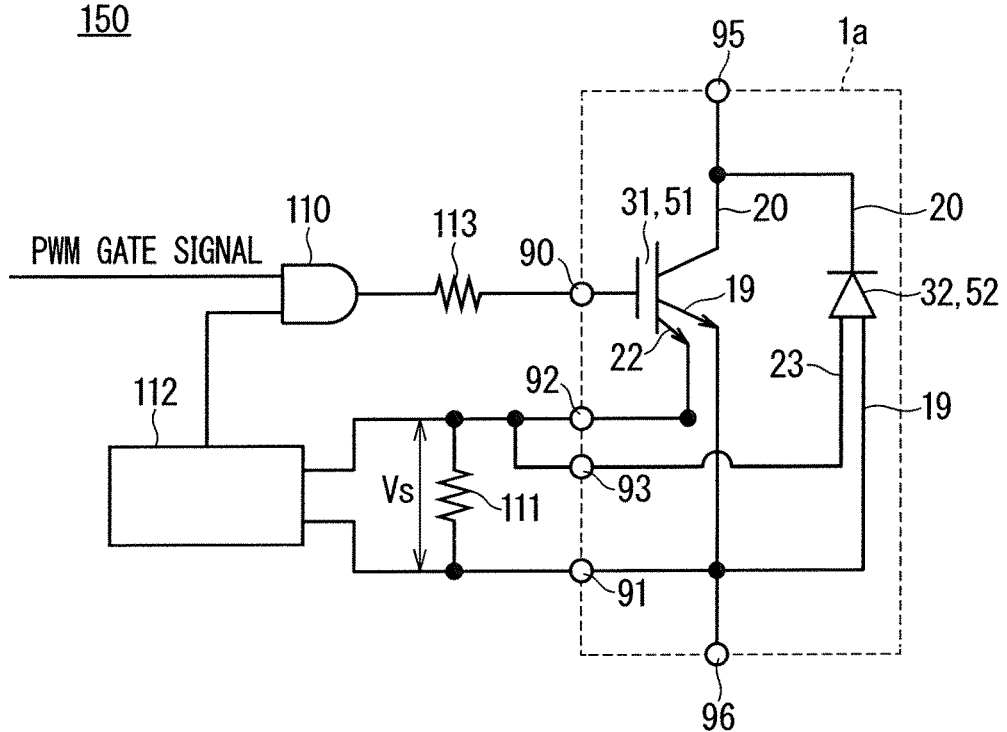
FIG. 3 is a diagram showing a feedback circuit according to the first embodiment.

As shown in FIG. 3, the feedback circuit 150 includes: the semiconductor device 1a; an AND circuit 110; a sense resistor 111; a feedback unit 112; and a gate resistor 113. In FIG. 3, the semiconductor device 1a is schematically shown by an equivalent circuit including an IGBT and a diode. A load and a power supply (not shown in the figures) are connected between the emitter terminal 96 and the collector terminal 95.

A Pulse width modulation (PWM) gate signal which is drive signal for driving the semiconductor device 1a and the output of the feedback unit 112 are input to the AND circuit 110. The PWM gate signal is generated in a PWM signal generating circuit or the like outside the feedback circuit 150 and is input to an input terminal of the AND circuit 110.

The AND circuit 110 is a logic circuit which outputs a high-level signal if and only if all of signals input to the AND circuit 110 are high-level signals.

When the signal input from the feedback unit 112 to the AND circuit 110 is a high-level signal, the PWM gate signal is allowed to pass the AND circuit 110, and the AND circuit 110 outputs the PWM gate signal which is input to the AND circuit 110. When the signal input from the feedback unit 112 to the AND circuit 110 is a low-level signal, the PWM gate signal is not allowed to pass the AND circuit 110. In other words, when the signal input from the feedback unit 112 to the AND circuit 110 is a low-level signal, the AND circuit 110 outputs low-level signal regardless of whether the PWM gate signal is a high-level signal or a low-level signal.

The AND circuit 110 is electrically connected to the gate pad 3a of the semiconductor device 1a via the gate resistor 113 and the gate terminal 90. The gate voltage applied to the gate electrodes 12 is controlled by the PWM gate signal applied from the AND circuit 110 to the semiconductor device 1a via the gate resistor 113 and the gate terminal 90.

When the PWM gate signal is a high-level signal and the PWM gate signal, which is a high-level signal, is allowed to pass the AND circuit 110, ON voltage is applied to the gate electrodes 12.

When the PWM gate signal is a low-level signal, the output of the AND circuit 110 is a low-level signal, and the OFF voltage is applied to the gate electrodes 12.

When the PWM gate signal is not allowed to pass the AND circuit 110, the output of the AND circuit 110 is a low-level signal, and the OFF voltage is applied to the gate electrodes 12.

One end of the sense resistor 111 is connected to the electrode 22 via the IGBT sense terminal 92 and is connected to the electrode 23 via the diode sense terminal 93.

The other end of the sense resistor 111 is connected to the electrode 19 via the emitter sense terminal 91. Accordingly, current of a magnitude corresponding to main current flowing through the IGBT main region 31 and current of a magnitude corresponding to main current flowing through the diode main region 32 flow through the sense resistor 111.

Electric potential difference Vs between both the ends of the sense resistor 111 is fed back to the feedback unit 112. In FIG. 3, a configuration in which the sense resistor 111 is commonly used for detection of current which flows through the IGBT main region 31 and for detection of current which flows through the diode main region 32. Different resistors may be used for the detection of current which flows through the IGBT main region 31 and for the detection of current which flows through the diode main region 32. With the configuration in which the sense resistor 111 is used for both the detection of current which flows through the IGBT main region 31 and the detection of current which flows through the diode main region 32, manufacturing cost of the feedback circuit 150 is suppressed.

The feedback unit 112 consists of a combination of circuits such as operational amplifiers.

The feedback unit 112 determines whether current is flowing through the diode main region 32 and whether excess current is flowing through the IGBT main region. The feedback unit 112 make the PWM gate signal input to the AND circuit 110 be allowed or be not allowed to pass the AND circuit 110 depending on the determination. The feedback unit 112 possesses a diode current detection threshold Vth1 for determining whether current is flowing through the diode main region 32 and an excess current detection threshold Vth2 for determining whether excess current is flowing through the IGBT main region 31. Vth1 and Vth2 are voltage values in the present embodiment.

When current is flowing in the direction from the second main surface 100b to the first main surface 100a in the IGBT main region 31, current hardly flow in the diode main region 32. When current is flowing in the direction from the second main surface 100b to the first main surface 100a in the IGBT main region 31, correspondingly, current flows in the direction from the second main surface 100b to the first main surface 100a in the IGBT sense region 51, and current flows through the sense resistor 111 in the direction from the IGBT sense terminal 92 through the sense resistor 111 to the emitter sense terminal 91. As a result, the electric potential difference Vs between both the ends of the sense resistor 111 is positive. Sign of the electric potential difference Vs between both the ends of the sense resistor 111 is defined such that Vs is positive when the electric potential in the end of the sense resistor 111 connected to the IGBT sense terminal 92 and the diode sense terminal 93 is higher than the electric potential in the end of the sense resistor 111 connected to the emitter sense terminal 91. When excess current is flowing through the IGBT main region 31, the electric potential difference Vs between both the ends of the sense resistor 111 is positive and becomes larger. Accordingly, the excess current detection threshold Vth2 is set to be positive. When the electric potential difference Vs between both the ends of the sense resistor 111 is higher than the excess current detection threshold Vth2, the feedback unit 112 determines that excess current is flowing through the IGBT main region 31. When the electric potential difference Vs between both the ends of the sense resistor 111 is lower than the excess current detection threshold Vth2, the feedback unit 112 determines that excess current is not flowing through the IGBT main region 31.

When current is flowing in the direction from the first main surface 100a to the second main surface 100b in the diode main region 32, current hardly flow in the IGBT main region 31. When current is flowing in the direction from the first main surface 100a to the second main surface 100b in the diode main region 32, correspondingly, current flows in the direction from the first main surface 100a to the second main surface 100b in the diode sense region 52, and current flows through the sense resistor 111 in the direction from the emitter sense terminal 91 through the sense resistor 111 to the diode sense terminal 93. In this case, the electric potential difference Vs between both the ends of the sense resistor 111 is negative. Accordingly, the diode current detection threshold Vth1 is set to be negative. When the electric potential difference Vs between both the ends of the sense resistor 111 is lower than the diode current detection threshold Vth1, the feedback unit 112 determines that current is flowing through the diode main region 32. When the electric potential difference Vs between both the ends of the sense resistor 111 is higher than the diode current detection threshold Vth1, the feedback unit 112 determines that current is not flowing through the diode main region 32.

When the electric potential difference Vs between both the ends of the sense resistor 111 is higher than the diode current detection threshold Vth1 and is lower than the excess current detection threshold Vth2, the feedback unit 112 outputs a high-level signal to AND circuit 110 so that the PWM gate signal input to the AND circuit 110 is allowed to pass the AND circuit 110. When the electric potential difference Vs between both the ends of the sense resistor 111 is lower than the diode current detection threshold Vth1 or is higher than the excess current detection threshold Vth2, the feedback unit 112 outputs a low-level signal to AND circuit 110 so that the PWM gate signal input to the AND circuit 110 is not allowed to pass the AND circuit 110.

When normal current, namely current which is not excess current, is flowing in the direction from the second main surface 100b to the first main surface 100a in the IGBT main region 31, the electric potential difference Vs between both the ends of the sense resistor 111 is higher than the diode current detection threshold Vth1 and is lower than the excess current detection threshold Vth2. Thus, the feedback unit 112 outputs a high-level signal to the AND circuit 110. As a result, the PWM gate signal is allowed to pass the AND circuit 110, and the current continues to flow in the direction from the second main surface 100b to the first main surface 100a.

When excess current is flowing in the direction from the second main surface 100b to the first main surface 100a in the IGBT main region 31, the electric potential difference Vs between both the ends of the sense resistor 111 is higher than the excess current detection threshold Vth2. Therefore, the feedback unit 112 outputs a low-level signal to the AND circuit 110. As a result, the PWM gate signal is not allowed to pass the AND circuit 110, and the OFF voltage is applied to the gate electrodes 12. As a result, a breakdown of the semiconductor device 1a due to the excess current flowing in the IGBT main region 31 is suppressed.

When current is flowing in the direction from the first main surface 100a to the second main surface 100b in the diode main region 32, the electric potential difference Vs between both the ends of the sense resistor 111 is negative. When the electric potential difference Vs is smaller than the diode current detection threshold Vth1, the feedback unit 112 outputs a low-level signal to the AND circuit 110. As a result, the PWM gate signal is not allowed to pass the AND circuit 110, and the OFF voltage is applied to the gate electrodes 12. As a result, the problem that the forward voltage Vf of the diode main region 32 increases and the forward loss of the diode main region 32 increases due to the ON voltage applied to the gate electrodes 12 is suppressed.

Figure 4:
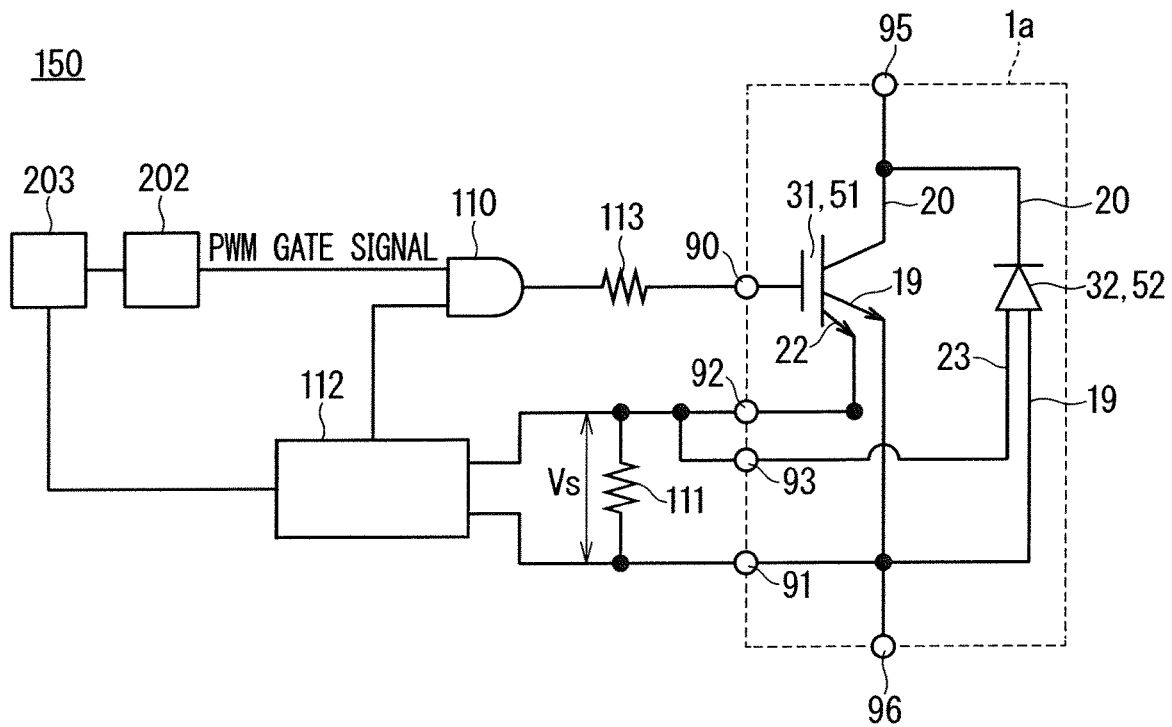
FIG. 4 is a diagram showing a feedback circuit according to the first embodiment.

The feedback circuit 150 may be a feedback circuit shown in FIG. 4.

The feedback circuit 150 shown in FIG. 4 is different from the feedback circuit 150 shown in FIG. 3 in that the feedback circuit 150 shown in FIG. 4 further includes a control circuit 203 and a drive circuit 202. The feedback unit 112 possesses an excess current detection threshold Vth3 for determining whether excess current is flowing through the diode main region 32, instead of the diode current detection threshold Vth1. When the electric potential difference Vs between both the ends of the sense resistor 111 is lower than the excess current detection threshold Vth3, the feedback unit 112 determines that excess current is flowing through the diode main region 32 and transmits the determination to the control circuit 203. The control circuit 203 operates protection circuit (not shown in the figures) to protect the semiconductor device 1a from the excess current, for example.

<A-3. Summary≤

As described above, the semiconductor device 1a is a semiconductor device in which an IGBT and a diode are formed in the common semiconductor base body 100. The semiconductor device 1a includes; the electrode 19, the electrode 20, the electrode 22 for current sensing; the electrode 23 for current sensing; and the gate electrodes 12.

The semiconductor base body 100 includes: the IGBT region 41 in which the IGBT is formed; the diode region 42 in which the diode is formed; and the separation region 40 provided between the IGBT region 41 and the diode region 42.

The electrode 19 is provided on the first main surface 100a in the IGBT region 41 and on the first main surface 100a in the diode region 42.

The electrode 20 is provided on the second main surface 100b in the IGBT region 41 and on the second main surface 100b in the diode region 42.

The electrode 22 is provided on the first main surface 100a in the IGBT sense region 51 of the IGBT region 41 of the semiconductor base body 100, at a distance from the electrode 19.

The electrode 23 is provided on the first main surface 100a in the diode sense region 52 of the IGBT region 42 of the semiconductor base body 100, at a distance from the electrode 19.

In the IGBT main region 31 of the IGBT region 41, the base layers 11a and the emitter layers 13 are electrically connected to the electrode 19 in the first main surface 100a.

In the IGBT sense region 51 of the IGBT region 41, the base layers 11a and the emitter layers 13 are electrically connected to the electrode 22 in the first main surface 100a.

In the IGBT region 41, the collector layer 4 is electrically connected to the electrode 20 in the second main surface 100b.

In the IGBT region 41, the gate electrodes 12 face the drift layer 10, the base layers 11a, and the emitter layers 13 via the gate insulating film 18.

In the diode main region 32 of the diode region 42, the anode layers 11c are electrically connected to the electrode 19 in the first main surface 100a.

In the diode sense region 52 of the diode region 42, the anode layers 11c are electrically connected to the electrode 23 in the first main surface 100a.

In the diode region 42, the cathode layer 15 is electrically connected to the electrode 20 in the second main surface 100b.

In the semiconductor device 1a, the IGBT region 41 and the diode region 42 are separated from each other by the separation region 40. The effect of the PWM gate signal input to the gate electrodes 12 via the gate terminal 90 on the forward current-forward voltage characteristics of the diode region 42 is small. Even when the ON voltage is applied to the gate electrodes 12 when the diode sense region 52 operates in forward direction, tendency that the electric potential of the anode layers 11c and the drift layer 10 become closer with each other is suppressed due to the separation region 40. As a result, a problem that the diode sense region 52 becomes difficult to operate in forward direction is suppressed. The similar applies for the diode main region 32. In other words, the ratio of current flowing through the diode sense region 52 to current flowing through the diode main region 32 is less sensitive to the gate signal input to the gate electrodes 12. As a result, excess current flowing through the diode main region 32 can be accurately detected by the diode sense region 52. For example, a breakdown by the excess current can be accurately controlled through the accurate detection of the excess current flowing through the diode main region 32. As a result, current-carrying performance of the diode main region 32 can be fully utilized.

In the direction perpendicular to the thickness direction of the semiconductor base body 100, the IGBT region 41 and the diode region 42 are formed at a sufficient distance with each other. This can suppress the problem that carriers which is accumulated in the drift layer 10 during the operation of the IGBT region 41, namely holes injected from the collector layer 14 to the drift layer 10, at least partially pass through the separation region 40, reach to the anode layers 11c of the diode region 42, and affect the forward current-forward voltage characteristics of the diode region 42. In other words, current detected by the diode sense region 52 accurately corresponds to current flowing in the diode main region 32.

<A-4. Others>

Even when the ratio of the size of the IGBT sense region 51 to the size of the IGBT main region 31 and the ration of the size of the diode sense region 52 to the size of the diode main region 32 are the same, a current value detected by the IGBT sense region 51 during the IGBT operation and a current value detected by the diode sense region 52 during the diode operation are not necessarily similar magnitude. This is because the ON current-ON voltage characteristics of the IGBT region 41 are largely affected by the channel resistance, whereas the forward current-forward voltage characteristics of the diode region 42 are hardly affected by the channel resistance.

By making the sense ratio of the IGBT and the sense ratio of the diode equal, a current value detected by the IGBT sense region 51 during the IGBT operation and a current value detected by the diode sense region 52 during the diode operation become similar magnitude.

Of the sense ratio of the IGBT and the sense ratio of the diode, the larger one is less than or equal to 1.2 times the smaller one, for example. The sense ratio of the IGBT is the ratio of current $I_1$ flowing through the electrode 19 to current $I_2$ flowing through the electrode 22, namely $I_1/I_2$, when ON voltage is applied to the gate electrodes 12 and a same negative voltage with respect to the electrode 20 is applied to the electrode 19 and the electrode 22. The sense ratio of the diode is the ratio of current $I_3$ flowing through the electrode 19 to current $I_4$ flowing through the electrode 23, namely $I_3/I_4$, when a same positive voltage with respect to the electrode 20 is applied to the electrode 19 and the electrode 23.

In a case where a current value detected by the IGBT sense region 51 and a current value detected by the diode sense region 52 are close, a common resistor like the sense resistor 111 in the feedback 150 can be used instead of using a sense resistor dedicated to IGBT and a sense resistor dedicated to diode separately, and the number of sense resistors can be reduced.

By changing the size of the electrode 23 in the diode sense region 52 and changing the contact resistance between the electrode 23 and the semiconductor base body 100, forward current-forward voltage characteristics of the diode sense region 52 can be changed and the ratio of current that flow through the diode main region 32 to current that flow through the diode sense region 52 can be changed. Similar applies for the IGBT region 41. Also, sensitivity of current detection can be changed without changing the sense resistor 111 by changing the sense ratio.

B. Second Embodiment

FIG. 1 is a plan view showing a schematic configuration of a semiconductor device 1b according to the second embodiment.

Figure 5:
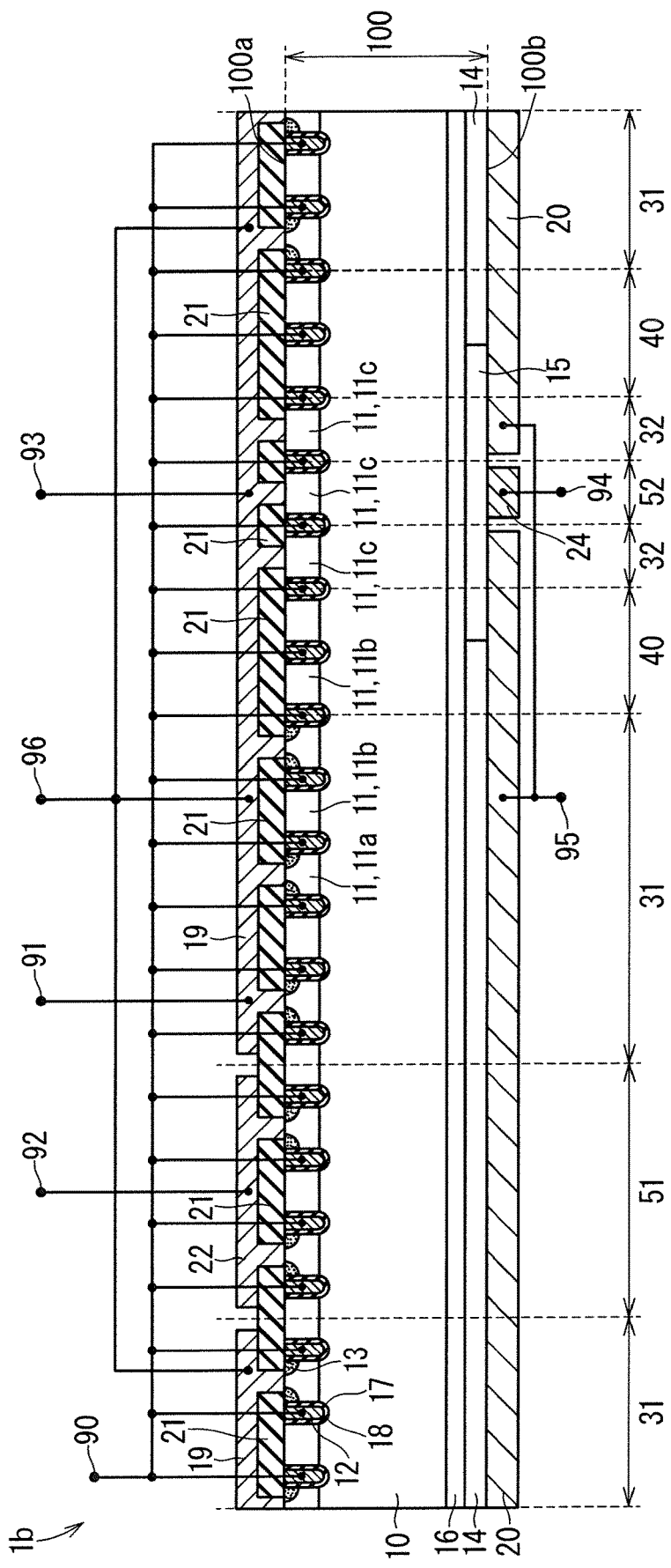
FIG. 5 is a cross-sectional view of a semiconductor device according to the second embodiment.

FIG. 5 is a cross-sectional view showing the configuration of the semiconductor device 1b according to the present embodiment, and is a cross-sectional view taken along the line I-I in FIG. 1.

The semiconductor device 1b is different from the semiconductor device 1a according to the first embodiment in the following points: the semiconductor device 1b does not includes the electrode 23 which is formed on the first main surface 100a at a distance from the electrode 19 in the first embodiment; the electrode 19 is provided on the first main surface 100a in the diode sense region 52; and an electrode 24 is provided on the second main surface 100b in the diode sense region 52 at a distance from the electrode 20. The semiconductor device 1b is otherwise similar to the semiconductor device 1a of the first embodiment.

In other words, unlike the semiconductor device 1a of the first embodiment in which sense current is taken out from the first main surface 100a side in the diode sense region 52, sense current is taken out from the second main surface 100b side in the diode sense region 52 in the present embodiment.

Since the sense current is taken out from the second main surface 100b side in the diode sense region 52, the semiconductor device 1b is advantageous in that wiring of the electrode 24 can be done when the semiconductor device 1b is solder bonded on a metal film on the external insulated substrate. Of the sense ratio of the IGBT and the sense ratio of the diode, the larger one is less than or equal to 1.2 times the smaller one, for example. The sense ratio of the IGBT is the ratio of current $I_5$ flowing through the electrode 19 to current $I_6$ flowing through the electrode 22, namely $I_5/I_6$, when ON voltage is applied to the gate electrodes 12 and a same negative voltage with respect to the electrode 20 is applied to the electrode 19 and the electrode 22. The sense ratio of the diode is the ratio of current $I_7$ flowing through the electrode 20 to current $I_8$ flowing through the electrode 24, namely $I_7/I_8$, when a same negative voltage with respect to the electrode 19 is applied to the electrode 20 and the electrode 24.

A large potential difference is generated between the electrode 22 provided on the first main surface 100a in the IGBT sense region 51 and the electrode 24 provided on the second main surface 100b in the diode sense region 52 during the operation process of the semiconductor device 1b. Therefore, different from the first embodiment in which the IGBT sense terminal 92 and the diode sense terminal 93 are directly connected to the sense resistor 111, when using the semiconductor device 1b in the feedback circuit, the diode sense terminal 94 connected to the electrode 24 cannot be directly connected to the sense resistor 111. The diode sense terminal 94 and the sense resistor 111 should be connected via a device for suppressing potential difference such as a level shift circuit, to prevent transmission of the large potential difference to the sense resistor 111 and to the feedback unit 112 or the electrode 19 via the sense resistor 111 and to prevent the breakdown of the feedback unit 112 or the semiconductor device 1b.

In the present embodiment as well, by applying ingenuity to the feedback circuit and performing similar control to that in the first embodiment, a breakdown of the semiconductor device 1b due to excess current in the diode region 42 can be suppressed, for example. In the present embodiment as well, since the separation region 40 is provided, current flowing through the diode main region 32 can be accurately detected by the diode sense region 52 and a breakdown of the semiconductor device 1b can be accurately controlled.

C. Third Embodiment

<C-1. Configuration>

Figure 6:
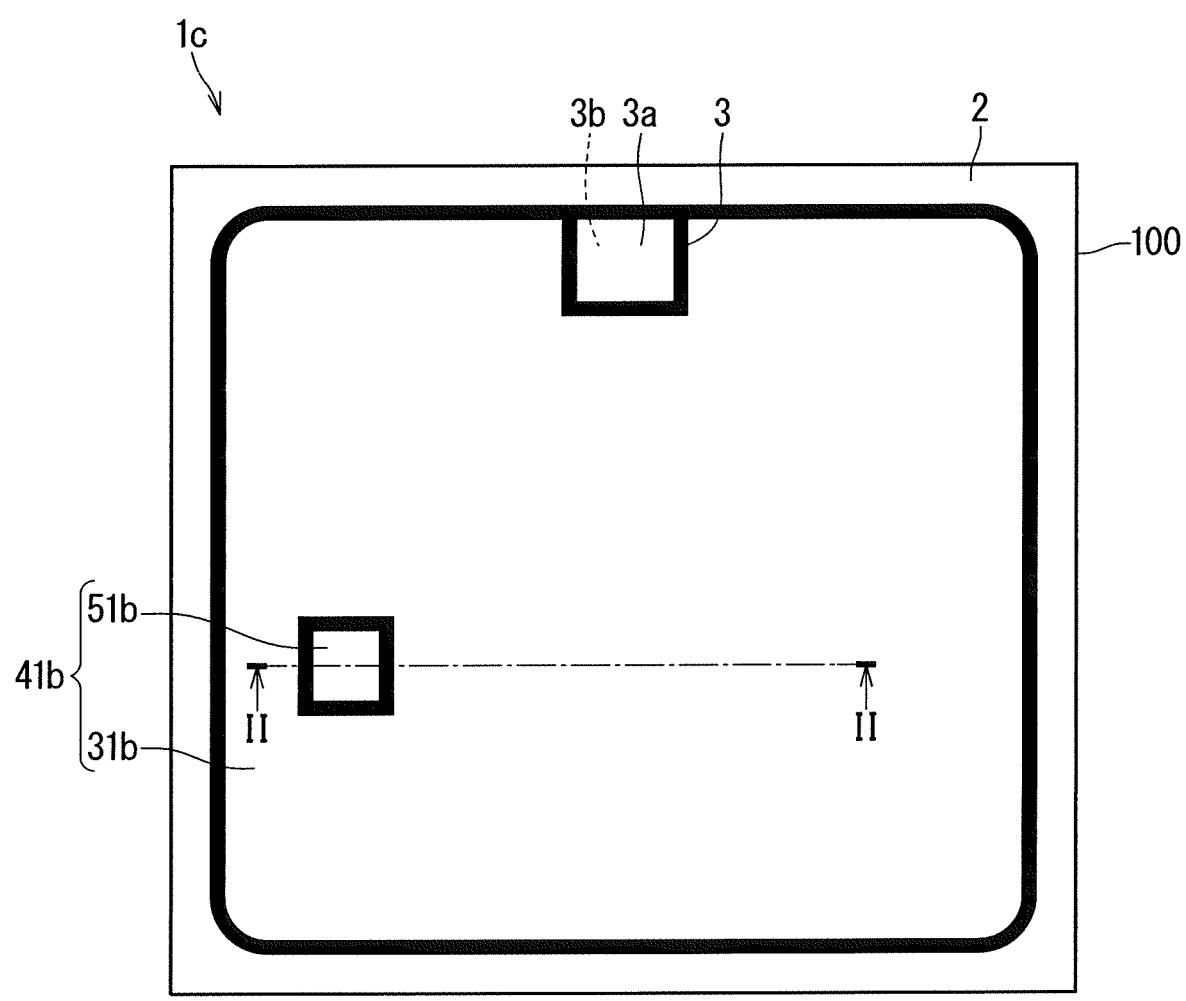
FIG. 6 is a plan view showing a schematic configuration of a semiconductor device according to the third embodiment.

FIG. 6 is a plan view showing schematic configuration of a semiconductor device 1c according to the third embodiment.

Figure 7:
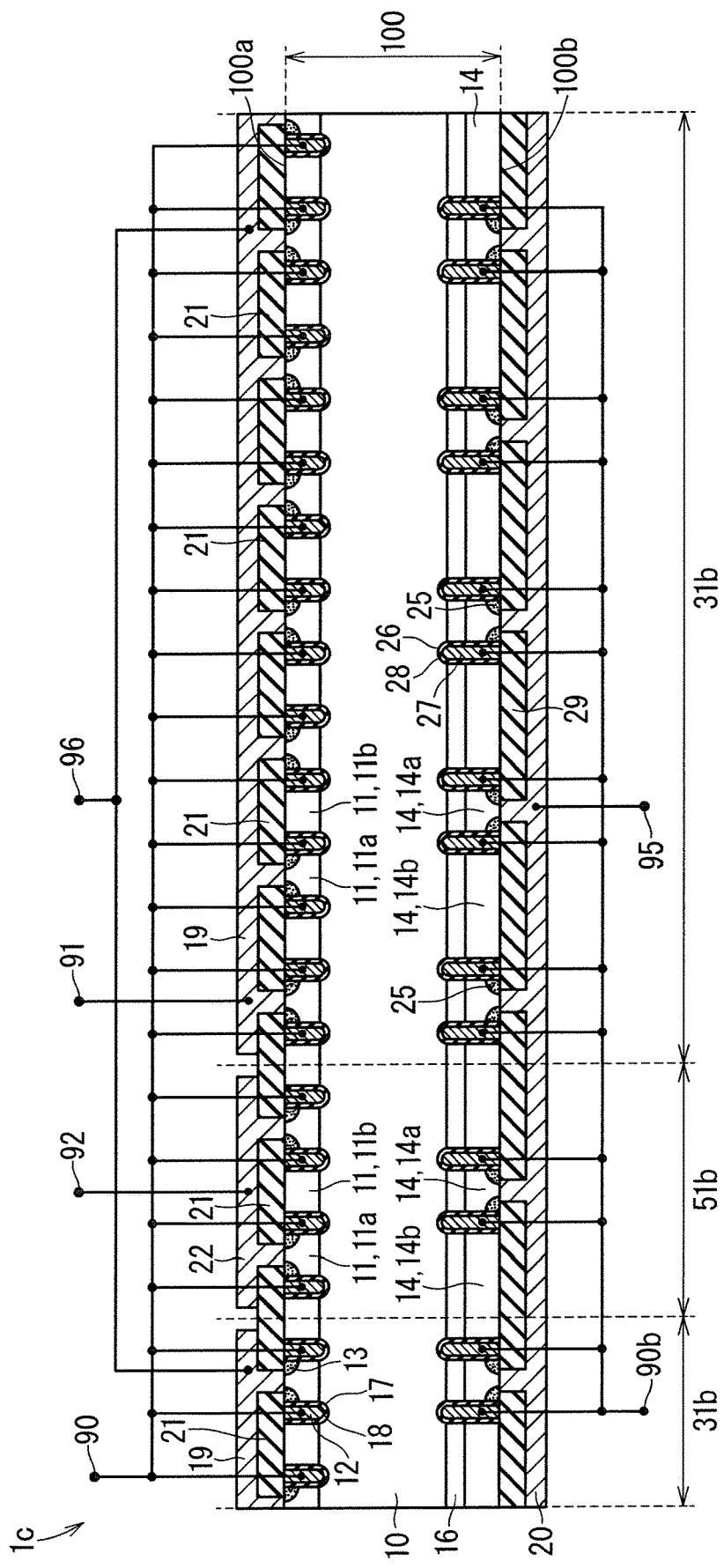
FIG. 7 is a cross-sectional view of a semiconductor device according to the third embodiment.

FIG. 7 is a cross-sectional view of the semiconductor device 1c taken along a line II-II in FIG. 6.

The semiconductor device 1c includes: the semiconductor base body 100; the electrode 19; the electrode 20; the electrode 22; the insulating film 21; and an insulating film 29.

As shown in FIG. 6, the semiconductor base body 100 includes: an IGBT region 41b in which an IGBT is formed; the pad region 3; and the termination region 2.

In the pad region 3, the gate pad 3a is provided on the first main surface 100a of the semiconductor base body 100. In the pad region 3, the gate pad 3b is provided on the second main surface 100b of the semiconductor base body 100. The gate pad 3a and the gate pad 3b are formed by using aluminum-based material, for example. The gate pad 3a is electrically separated from the electrode 19 and the electrode 22. The gate pad 3a is electrically connected to the gate electrodes 12. A drive signal is input to the gate electrodes 12 from the outside through the gate pad 3a. The gate pad 3b is electrically separated from the electrode 20. The gate pad 3b is electrically connected to gate electrodes 27 which are described below. A drive signal is input to the gate electrodes 27 from the outside through the gate pad 3b.

The termination region 2 is similar to that described in the first embodiment. As shown in FIG. 7, the semiconductor base body 100 has the first main surface 100a and the second main surface 100b as one main surface and the other main surface. The semiconductor device 1c of present embodiment is a Back-Gate-Controlled IGBT (BC-IGBT) having a MOS gate in the second main surface 100b side in addition to having a MOS gate in the first main surface 100a side. Gate control allows the semiconductor device 1c to function as an IGBT element and as a free wheeling diode element.

The IGBT region 41b includes an IGBT main region 31b and an IGBT sense region 51b.

The electrode 20 is provided on the second main surface 100b in the IGBT main region 31b and the IGBT sense region 51b. The IGBT main region 31b and the IGBT sense region 51b share the electrode 20. On the other hand, the electrode 19 provided on the first main surface 100a of the IGBT main region 31b and the electrode 22 provided on the first main surface 100a of the IGBT sense region 51b are separated from each other.

The area of the IGBT sense region 51b in plan view is smaller than the area of the IGBT main region 31b in plan view. In plan view, the area of the IGBT sense region 51b is more than or equal to 1/3000 times and less than or equal to 1/300 times the area of the IGBT main region 31b, for example. In plan view, the area of the IGBT sense region 51b is about 1/1000 times the area of the IGBT main region 31b, for example. The IGBT main region 31b and the IGBT sense region 51b have similar structures except for the difference in size in plan view. The structures of the IGBT main region 31b and the IGBT sense region 51b are described below as the structure of the IGBT region 41b.

The semiconductor device 1c is manufactured by using an n⁻ type single crystal bulk silicon substrate with impurity concentration of about $1\times10^{14}$ cm$^{-3}$, for example. The single crystal bulk silicon substrate is a substrate manufactured by the floating zone (FZ) method, for example. The single crystal bulk silicon substrate corresponds to the semiconductor base body 100.

In the IGBT region 41b, the semiconductor base body 100 includes: the n⁻ type drift layer 10; the n type buffer layer 16; the p⁺ type collector layer 14; the p type base layer 11; the n⁺ type emitter layers 13; and n⁺ type collector layers 25.

The base layer 11 is provided on the first main surface 100a side of the drift layer 10.

The emitter layers 13 are selectively provided on the first main surface 100a side of the base layer 11.

Trenches 17 extending from the first main surface 100a through the emitter layers 13 and the base layer 11 to the drift layer 10 are provided in the semiconductor base body 100. In each of the trenches 17, a gate electrode 12 is provided via a gate insulating film 18 provided on the side surface and bottom surface of the trench 17. The gate electrodes 12 are, for example, formed by using polysilicon with impurity concentration of $1\times10^{20}$ cm$^{-3}$. The trenches 17 are, for example, provided such that they extend in one of in-plane directions.

The gate electrodes 12 face the emitter layers 13, the base layer 11, and the drift layer 10 via the gate insulating films 18.

In the IGBT region 41b, the base layer 11 includes the base layers 11a and base layers 11b.

A base layer 11a is a mesa shape region of the plurality of mesa shape regions formed by dividing the base layer 11 by the trenches 17 and is a mesa shape region where the emitter layers 13 are selectively formed in the first main surface 100a side surface layer thereof. A base layer 11b is a mesa shape region of the plurality of mesa shape regions formed by dividing the base layer 11 by the trenches 17 and is a mesa shape region where the emitter layers 13 are not formed in the first main surface 100a side surface layer thereof. The base layers 11a and the base layers 11b are, for example, placed alternately along the direction intersecting the extending direction of the trenches 17.

In the present embodiment, the thickness of the emitter layers 13 is, for example, about 0.5 μm, and the impurity concentration of the emitter layers 13 is, for example, about $3\times10^{19}$ cm$^{-3}$.

In the IGBT main region 31b, the emitter layers 13 and the base layers 11a are electrically connected to the electrode 19 in the first main surface 100a. The electrode 19 works as an emitter electrode of the IGBT element formed in the IGBT region 41b.

In the IGBT sense region 51b, the emitter layers 13 and the base layers 11a are electrically connected to the electrode 22 in the first main surface 100a.

The regions of the base layers 11a which face the gate electrodes 12 works as channel regions of the IGBT element formed in the IGBT region 41b.

Most of the first main surface 100a side surface of the base layers 11b is covered by the insulating film 21. Only part of the first main surface 100a side surface of the base layers 11b which is not covered by the insulating film 21 is connected to the electrode 19. The area of the part where the base layers 11b and the electrode 19 are connected is small, and the electrical resistance of the path which passes through the part where the base layers 11b and the electrode 19 are connected is high. The region where the base layers 11b and the electrode 19 are connected is not shown in the figures.

The buffer layer 16 is provided on the second main surface 100b side of the drift layer 10.

The buffer layer 16 is for suppressing the extension of the depletion layer which extends from the pn junction of the border between the drift layer 10 and the base layer 11. The collector layer 14 is provided on the second main surface 100b side of the buffer layer 16. The thickness of the collector layer 14 is, for example, about 0.5 µm, and the impurity concentration of the collector layer 14 is, for example, about $1\times10^{18}$ cm$^{-3}$.

The collector layers 25 are selectively provided on the second main surface 100b side of the collector layer 14.

Trenches 26 extending from the second main surface 100b through the collector layers 25 and the collector layer 14 to the drift layer 10 are provided in the semiconductor base body 100. In each of the trenches 26, a gate electrode 27 is provided via a gate insulating film 28 provided on the side surface and bottom surface of the trench 26. The gate electrodes 27 are, for example, formed by using polysilicon with impurity concentration of $1\times10^{20}$ cm$^{-3}$. The trenches 26 are, for example, provided such that they extend in one of in-plane directions. The extending direction of the trenches 17 and the extending direction the trenches 26 may or may not be the same.

The gate electrodes 27 face the collector layers 25, the collector layer 14, the buffer layer 16, and the drift layer 10 via the gate insulating films 28.

In the IGBT region 41b, the collector layer 14 includes collector layers 14a and collector layers 14b.

A collector layer 14a is a mesa shape region of the plurality of mesa shape regions formed by dividing the collector layer 14 by the trenches 26 and is a mesa shape region where the collector layers 25 are selectively formed in the second main surface 100b side surface layer thereof. A collector layer 14b is a mesa shape region of the plurality of mesa shape regions formed by dividing the collector layer 14 by the trenches 26 and is a mesa shape region where the collector layers 25 are not formed in the second main surface 100b side surface layer thereof. The collector layers 14a and the collector layers 14b are, for example, placed alternately along the direction intersecting the extending direction of the trenches 26.

The collector layers 14a and the collector layers 25 are electrically connected to the electrode 20 in the second main surface 100b.

The regions of the collector layers 14a which face the gate electrodes 27 works as channel regions of the IGBT element formed in the IGBT region 41b. Accordingly, a current path is formed from the electrode 19 through the base layers 11a, the drift layer 10, the buffer layer 16, the channel regions of the collector layers 14a, and the collector layers 25 to the electrode 20, and the semiconductor device 1c can carry current in the direction corresponding to the direction of current of the diode formed in the semiconductor device 1a, which is an RC-IGBT.

Most of the second main surface 100b side surface of the base layers 14b is covered by the insulating film 29. Only part of the second main surface 100b side surface of the base layers 14b which is not covered by the insulating film 29 is connected to the electrode 20. The area of the part where the base layers 14b and the electrode 20 are connected is small, and the electrical resistance of the path which passes through the part where the base layers 14b and the electrode 20 are connected is high. The region where the base layers 14b and the electrode 20 are connected is not shown in the figures.

<C-2. Operation>

FIG. 8 shows operating modes of the semiconductor device 1c which is BC-IGBT depending on the gate control.

The semiconductor device 1c has operating modes 1 to 8. The operating modes are classified by sign of a collector voltage, the first gate voltage applied to the gate electrodes 12, and the second gate voltage applied to the gate electrodes 27. The collector voltage represents the electric potential of the electrode 20 when the electrode 19 is grounded and the electric potential of the electrode 19 is zero.

In FIG. 8, "applied" in the field of the gate voltage represents that ON voltage is applied, and "not applied" in the field of the gate voltage represents that ON voltage is not applied.

In FIG. 8, the column of "aspect" represents whether current is flowing or not and in which direction the current is flowing if current is flowing, when the semiconductor device 1c is normally operating. In the column of "aspect" and in the descriptions of the present embodiment in the following, forward current represents current flowing in the direction from the electrode 20 to the electrode 19, and reverse current represents current flowing in the direction from the electrode 19 to the electrode 20.

In the operating modes 2 and 3, the semiconductor device 1c carries current in the direction corresponding to the direction of current of the IGBT formed in the semiconductor device 1a, which is an RC-IGBT. In the operating modes 7 and 8, the semiconductor device 1c carries current in the direction corresponding to the direction of current of the diode formed in the semiconductor device 1a, which is an RC-IGBT. By the operating modes 7 and 8, the semiconductor device 1c can fulfill the function similar to that of free wheel diode element.

Current-voltage characteristics of forward current vary depending on the drive signal input to the gate electrodes 27. Namely, the operating mode 2 and the operating mode 3 differ in current-voltage characteristics.

Current-voltage characteristics of reverse current vary depending on the drive signal input to the gate electrodes 12. Namely, the operating mode 7 and the operating mode 8 differ in current-voltage characteristics.

Although the current-voltage characteristics of forward current varies depending on the drive signal input to the gate electrodes 27, since the current-voltage characteristics in the IGBT main region 31b and in the IGBT sense region 51b vary in a corresponding manner, variation of the ratio of the current flowing through the IGBT main region 31b to the current flowing through the IGBT sense region 51b is suppressed. Thus, forward current flowing through the IGBT main region 31b can be detected accurately by the IGBT sense region 51b. Similarly, reverse current flowing through the IGBT main region 31b can be detected accurately by the IGBT sense region 51b.

As in the case of the feedback circuit 150 explained in the first embodiment, a thermal breakdown of the semiconductor device 1c can be suppressed by using a feedback circuit. For that purpose, the electrode 22 is connected to one end of a sense resistor of the feedback circuit, the electrode 19 is connected to the other end of the sense resistor, electric potential difference Vs between both the ends of the sense resistor is detected, the electric potential difference Vs between both the ends of the sense resistor is compared with the Vth2 for determining whether forward current is excess current or not and with the Vth3 for determining whether reverse current is excess current or not, and the result of the comparison is fed back to the gate signal.

In the operating modes 2 or 3, electric potential difference Vs between both the ends of the sense resistor is positive. Namely, electric potential in the end of the sense resistor connected to the electrode 19 is lower than the electric potential in the other end of the sense resistor. In the operating modes 7 or 8, electric potential difference Vs between both the ends of the sense resistor is negative. Namely, electric potential in the end of the sense resistor connected to the electrode 19 is higher than the electric potential in the other end of the sense resistor.

<C-3. Modification example>

Figure 9:
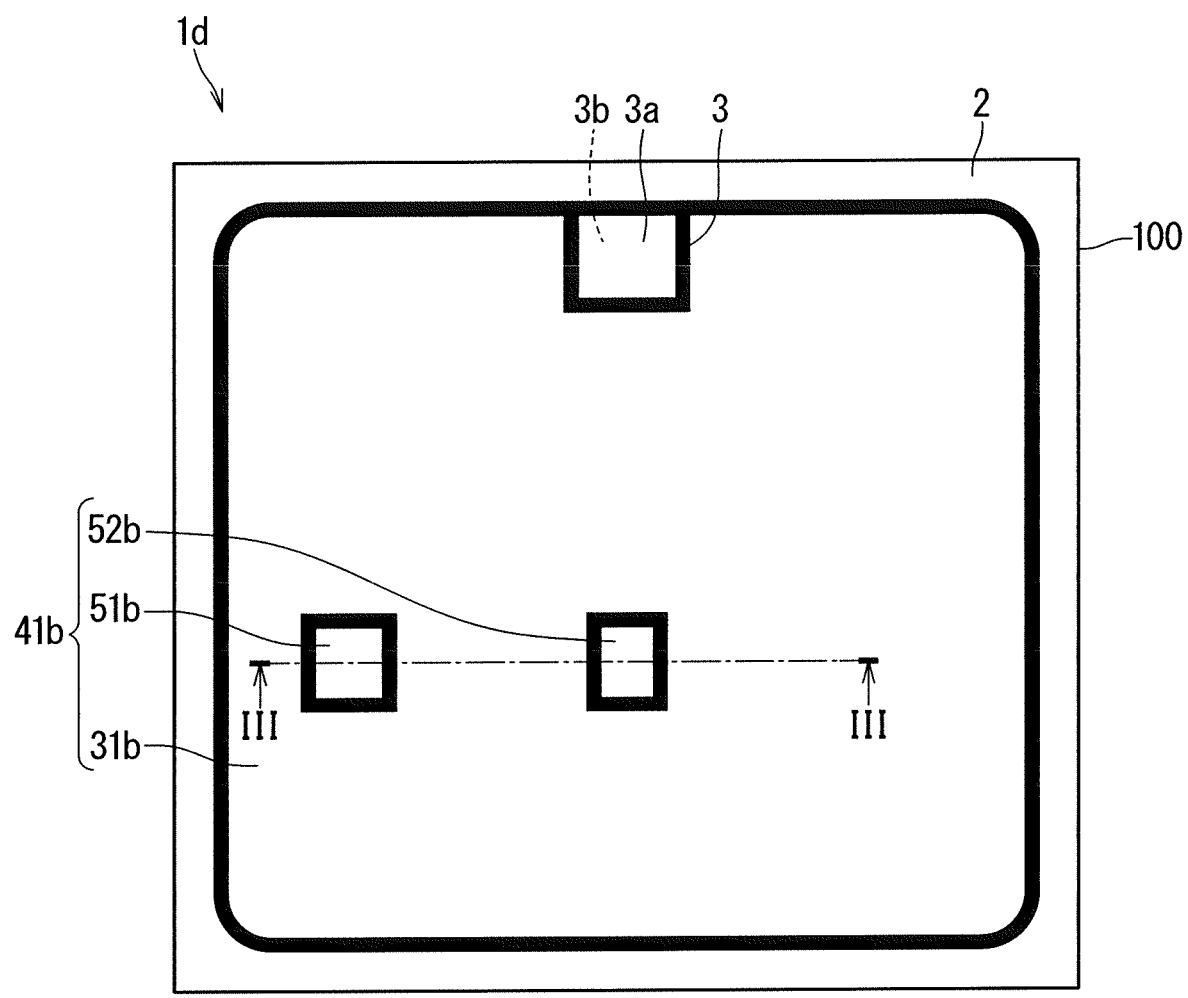
FIG. 9 is a plan view showing a schematic configuration of a modification of a semiconductor device according to the third embodiment.
Figure 10:
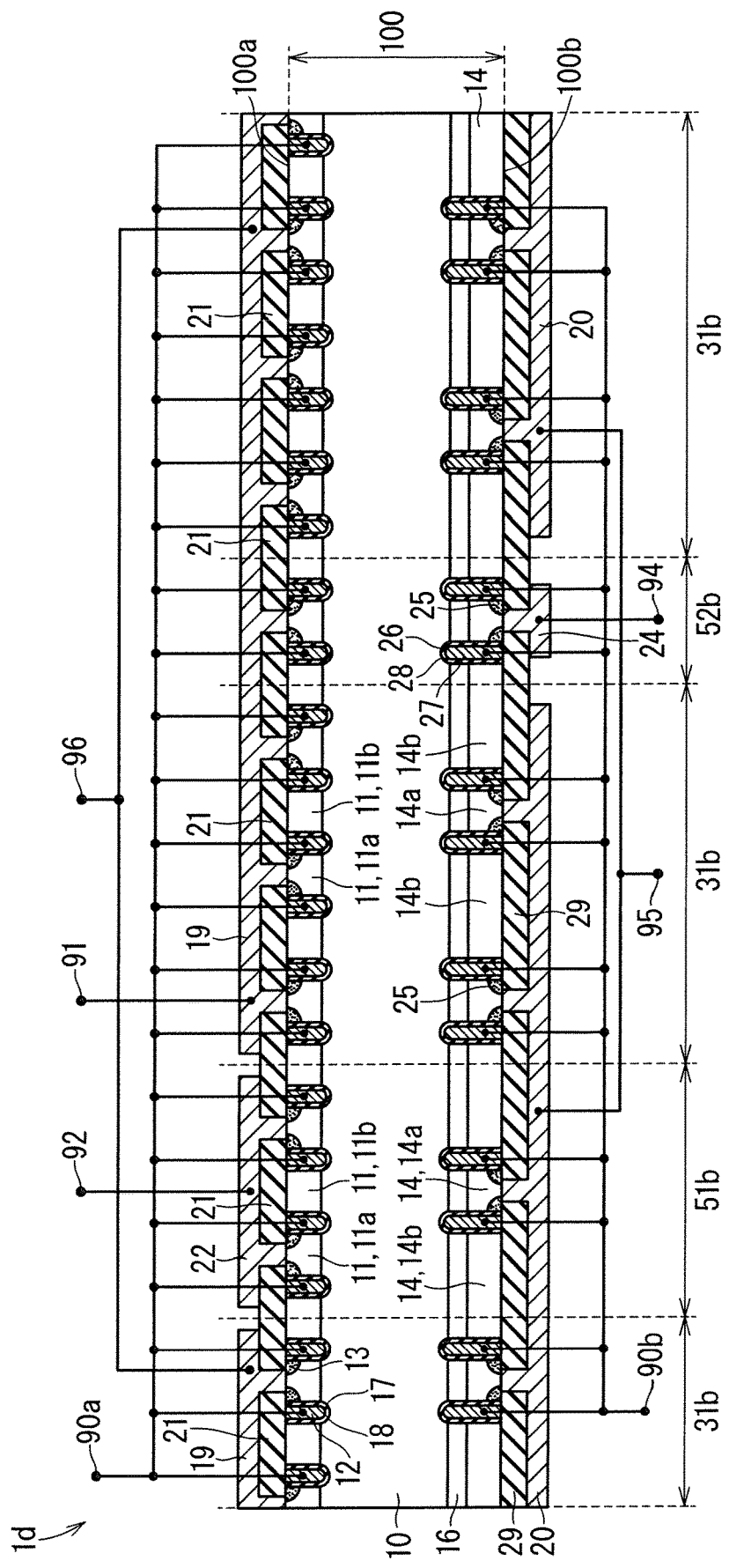
FIG. 10 is a cross-sectional view of a modification of a semiconductor device according to the third embodiment.

In the present embodiment, a configuration in which the IGBT sense region 51b is used to detect both of forward current and reverse current is described above. A semiconductor device 1d including an IGBT sense region 51b and an IGBT sense region 52b as shown in FIGS. 9 and 10 can also accurately suppress a thermal breakdown of the semiconductor device 1d similarly. FIG. 10 is a cross-sectional view along a line III-III in FIG. 9.

The semiconductor device 1d is different from the semiconductor device 1c in that the IGBT region 41b further includes the IGBT sense region 52b and that the electrode 24 is provided on the second main surface 100b in the IGBT sense region 52b at a distance from the electrode 20. The semiconductor device 1d is otherwise similar to the semiconductor device 1c.

The structure of the semiconductor base body 100 in the IGBT sense region 52b is similar to the structure of the semiconductor base body 100 in the IGBT main region 31b and the IGBT sense region 51b.

In the semiconductor device 1d, forward current is detected by the IGBT sense region 51b, and reverse current is detected by the IGBT sense region 52b. As in the case of the semiconductor device 1c, in the semiconductor device 1d, forward current and reverse current can be detected with suppressed effect of the drive signal input to the gate electrodes 12 or the gate electrodes 27.

<C-4. Others>

Since the termination region 2 is provided in outer periphery of the first main surface 100a side surface layer of the semiconductor base body 100, area of the effective operating region in the first main surface 100a side is smaller than that in the second main surface 100b side. Accordingly, in the semiconductor device 1c, the sense ratio of forward current and the sense ratio of reverse current are different even though both the forward current and the reverse current are detected by the IGBT sense region 51. Also, even when the ratio of the size of the IGBT sense region 51b to the size of the IGBT main region 31b and the ratio of the size of the IGBT sense region 52b to the size of the IGBT main region 31b is the same, the sense ratio of forward current and the sense ratio of reverse current is different.

In the semiconductor device 1c and the semiconductor device 1d, current-voltage characteristics of forward current is affected by the channel resistance of the channel formed in the base layer 11, whereas current-voltage characteristics of reverse current is affected by the channel resistance of the channel formed in the collector layer 14. Difference of the channel resistance of the channel formed in the base layer 11 and the channel resistance of the channel formed in the collector layer 14 cause difference between sense ratio of forward current and sense ratio of reverse current.

Figure 11:
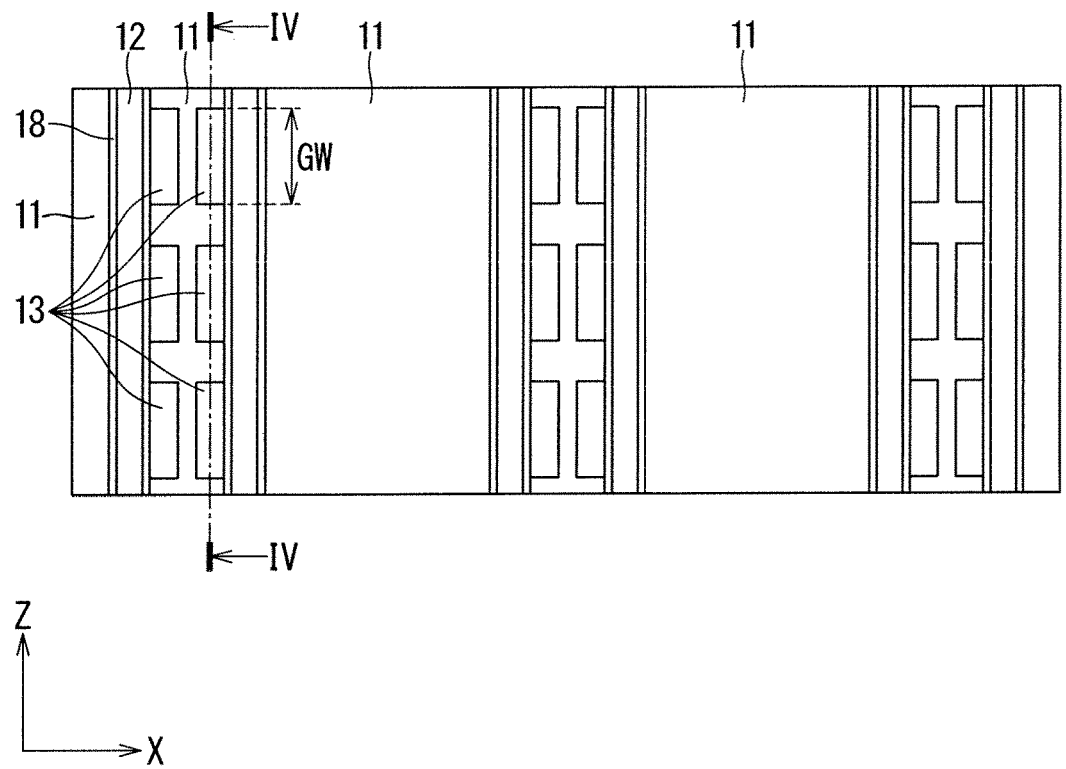
FIGS. 11 and 12 are plan views schematically showing a first main surface of a semiconductor base body of a semiconductor device according to the third embodiment.
Figure 13:
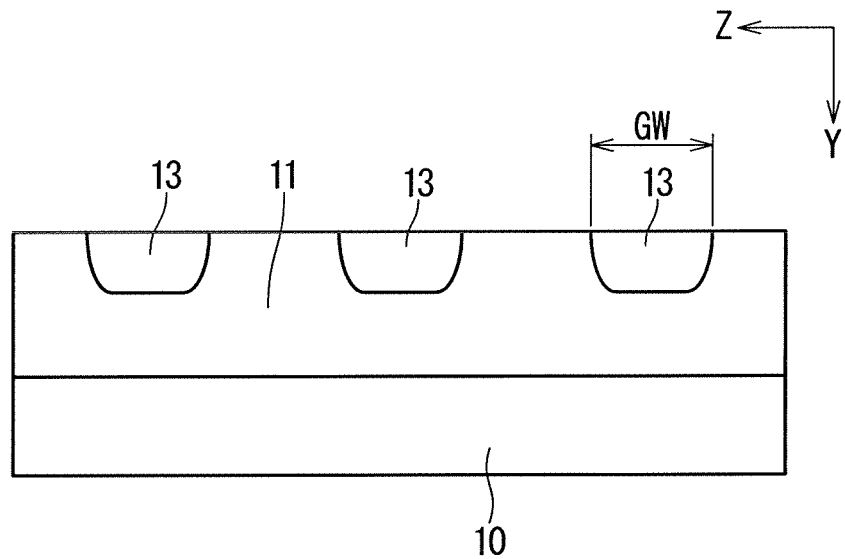
FIG. 13 is a cross-sectional view showing neighborhood of a first main surface of a semiconductor base body of a semiconductor device according to the third embodiment.

Channel resistance is affected by the impurity concentration of the semiconductor in which the channel is formed, channel length, the channel width, and the like. Among these, channel width is less sensitive to the manufacturing process and is easy to optimize. FIG. 11 is a schematic plan view of the first main surface 100a in the IGBT main region 31b. FIG. 13 is a cross-sectional view along a line IV-IV in FIG. 11 and showing gate width GW of the emitter layers 13. The gate width GW of the emitter layers 13 represents the width where each region of the emitter layers 13 is in contact with the trenches 17 in the first main surface 100a. The gate width of the emitter layers 13 is a width in the extending direction of the trenches 17. In FIG. 13, only neighborhood of the first main surface 100a is shown.

Figure 12:
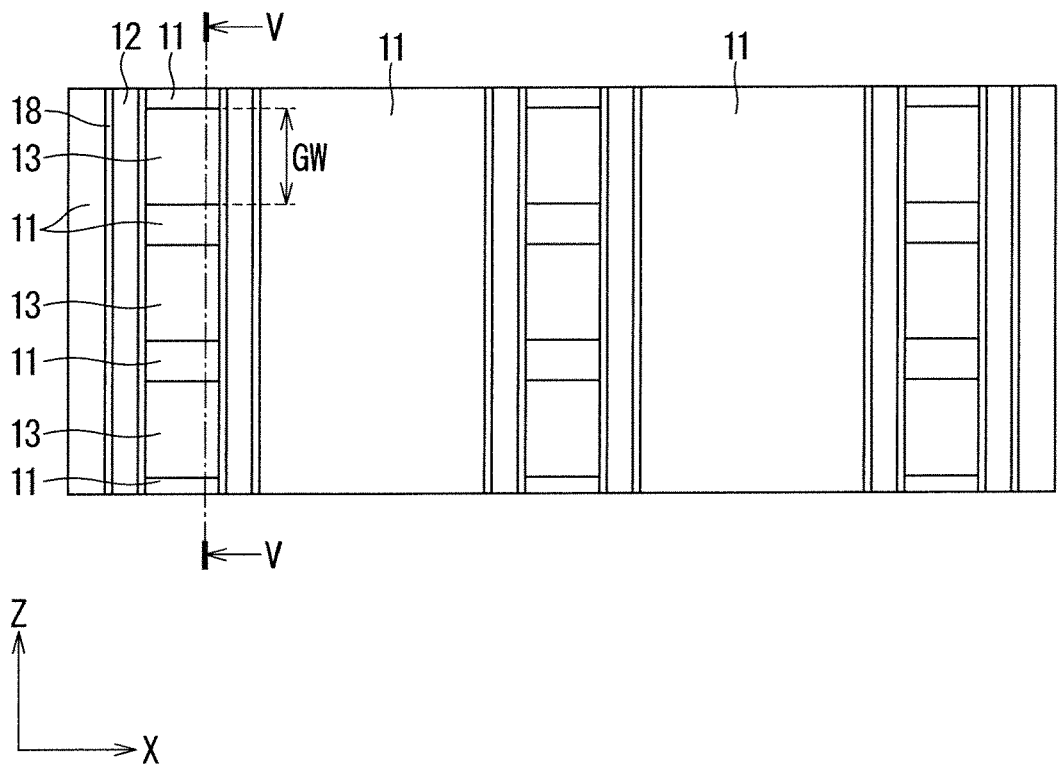

An emitter layer 13 may not be connected between one trench 17 and another trench 17 in a mesa shape region formed by dividing the base layer 11 by the trenches 17 as shown in FIG. 10 and FIG. 11 and may be connected between the one trench 17 and another trench 17 as shown in FIG. 12.

By changing the gate width of the emitter layers 13 in the IGBT sense region 51b or in the IGBT main region 31b, channel resistance in the IGBT sense region 51b or the IGBT main region 31b is changed, and ratio of forward current which flows through the IGBT main region 31 to forward current which flows through the IGBT sense region 51b is changed. Therefore, sense ratio of forward current of the semiconductor device 1c can be changed without changing the size of the IGBT sense region 51b and the external circuit of the semiconductor device 1c. Also, in this case, the change of the ratio of reverse current which flows through the IGBT main region 31b to reverse current which flows through the IGBT sense region 51b is smaller than the change of the ratio of forward current which flows through the IGBT main region 31b to forward current which flows through the IGBT sense region 51b. Therefore, by changing the gate width of the emitter layers 13 in the IGBT sense region 51b or in the IGBT main region 31b, the sense ratios of forward current and reverse current can be adjusted to be the same.

Similarly, in the semiconductor device 1c, by changing the gate width of the collector layers 25 in the IGBT sense region 51b or the IGBT main region 31b, the sense ratios of forward current and reverse current can be adjusted to be the same. The gate width of the collector layers 25 represents the width where each region of the collector layers 25 is in contact with the trenches 26 in the second main surface 100b. The gate width of the collector layers 25 is a width in the extending direction of the trenches 26.

In the semiconductor device 1c, of the sense ratio of forward current and the sense ratio of reverse current, the larger one is smaller than or equal to 1.2 times the smaller one, for example. For that purpose, the ratio W1/W2 and the ratio W3/W4 are, for example, different. Here, W1 is the sum of the gate width of the emitter layers 13 in the region overlapping in plan view with the region where the electrode 19 is provided on the first main surface 100a, W2 is the sum of the gate width of the emitter layers 13 in the region overlapping in plan view with the region where the electrode 22 is provided on the first main surface 100a, W3 is the sum of the gate width of the collector layers 25 in the region overlapping in plan view with the region where the electrode 19 is provided on the first main surface 100a, and W4 is the sum of the gate width of the collector layers 25 in the region overlapping in plan view with the region where the electrode 22 is provided on the first main surface 100a.

In the semiconductor device 1c, the sense ratio of forward current is the ratio of current $I_9$ flowing through the electrode 19 to current $I_{10}$ flowing through the electrode 22, namely $I_9/I_{10}$, when ON voltage is applied to the gate electrodes 12 and a same negative voltage with respect to the electrode 20 is applied to the electrode 19 and the electrode 22. In the semiconductor device 1c, the sense ratio of reverse current is the ratio of current $I_{11}$ flowing through the electrode 19 to current $I_{12}$ flowing through the electrode 22, namely $I_{11}/I_{12}$, when ON voltage is applied to the gate electrodes 27 and a same positive voltage with respect to the electrode 20 is applied to the electrode 19 and the electrode 22.

Similarly, in the case of semiconductor device 1d, the sense ratios of forward current and reverse current can be adjusted to be the same by changing the gate width of the emitter layers 13 in the IGBT sense region 51b, the gate width of the emitter layers 13 in the IGBT main region 31b, the gate width of the collector layers 25 in the IGBT sense region 52b, or the gate width of the collector layers 25 in the IGBT main region 31b.

In the semiconductor device 1d, of the sense ratio of forward current and the sense ratio of reverse current, the larger one is smaller than or equal to 1.2 times the smaller one, for example. For that purpose, the ratio W5/W6 and the ratio W7/W8 are, for example, different. Here, W5 is the sum of the gate width of the emitter layers 13 in the region overlapping in plan view with the region where the electrode 19 is provided on the first main surface 100a, W6 is the sum of the gate width of the emitter layers 13 in the region overlapping in plan view with the region where the electrode 22 is provided on the first main surface 100a, W7 is the sum of the gate width of the collector layers 25 in the region overlapping in plan view with the region where the electrode 20 is provided on the second main surface 100b, and W8 is the sum of the gate width of the collector layers 25 in the region overlapping in plan view with the region where the electrode 24 is provided on the second main surface 100b.

In the semiconductor device 1d, the sense ratio of forward current is the ratio of current $I_{13}$ flowing through the electrode 19 to current $I_{14}$ flowing through the electrode 22, namely $I_{13}/I_{14}$, when ON voltage is applied to the gate electrodes 12 and a same negative voltage with respect to the electrode 20 is applied to the electrode 19 and the electrode 22. In the semiconductor device 1d, the sense ratio of reverse current is the ratio of current $I_{15}$ flowing through the electrode 20 to current $I_{16}$ flowing through the electrode 24, namely $I_{15}/I_{16}$, when ON voltage is applied to the gate electrodes 27 and a same positive voltage with respect to the electrode 19 is applied to the electrode 20 and the electrode 24.

In the semiconductor device 1d, the area of the electrode 22 in plan view may be different from the area of the electrode 24 in plan view, so that the larger one of the sense ratios of forward current and reverse current is smaller than or equal to 1.2 times the smaller one of the sense ratios of forward current and reverse current.

D. Fourth Embodiment

In the present embodiment, the semiconductor device according to any one of the above-mentioned first to third embodiments is applied to a power conversion device. Application of the semiconductor device according to any one of the first to third embodiments is not limited to a specific power conversion device. The following describes the case where the semiconductor device according to any one of the first to third embodiments is applied to a three-phase inverter as the fourth embodiment.

Figure 14:
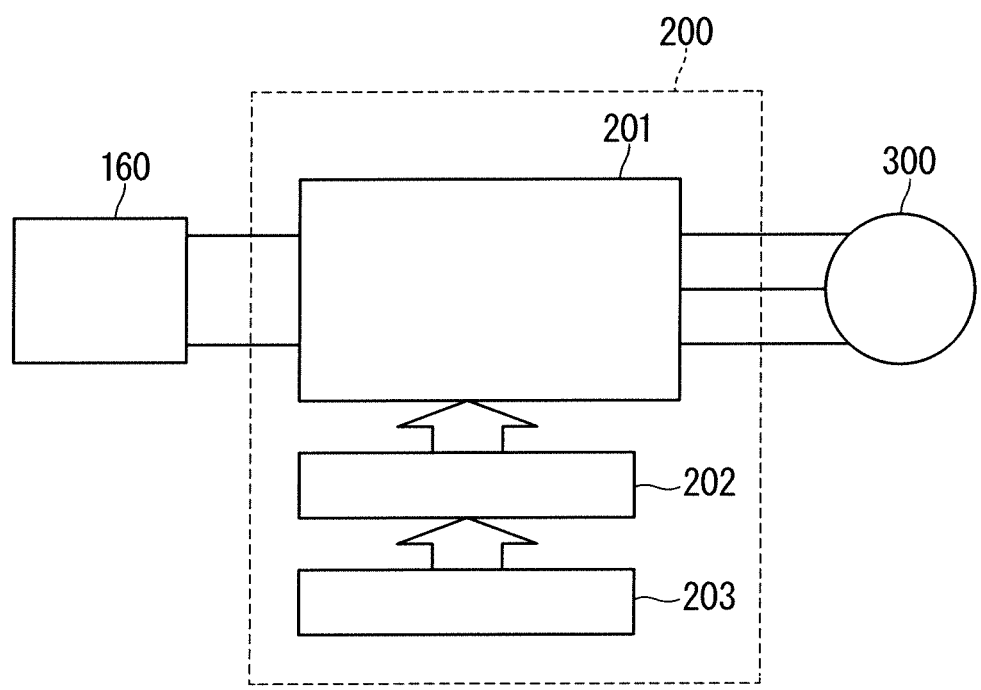
FIG. 14 is a block diagram showing a configuration of power conversion system to which a power conversion device according to the fourth embodiment is applied.

FIG. 14 is a block diagram showing a configuration of a power conversion system to which a power conversion device according to the present embodiment is applied.

The power conversion system shown in FIG. 14 includes a power supply 160, a power conversion device 200, and a load 300. The power supply 160 is a direct current (DC) power supply and supplies DC power to the power conversion device 200. The power supply 160 can be configured of various types of devices, and may be configured of a DC system, a solar cell, or a storage battery, for example, or may be configured of a rectifier circuit connected to an alternating-current (AC) system or an AC/DC converter. Also, the power supply 160 may be configured of a DC/DC converter that converts DC power output from the DC system into predetermined power.

The power conversion device 200, which is a three phase inverter connected between the power supply 160 and the load 300, converts the DC power supplied from the power supply 160 into AC power, and supplies the AC power to the load 300. The power conversion device 200 includes: a main conversion circuit 201 which converts DC power into AC power and outputs the AC power; the drive circuit 202 which outputs a drive signal for driving each switching element of the main conversion circuit 201; and the control circuit 203 which outputs a control signal for controlling the drive circuit 202 to the drive circuit 202, as shown in FIG. 14. Although the output of the drive circuit 202 is input to the semiconductor device 1a via the AND circuit 110 in the configuration shown in FIG. 4, the drive circuit 202 may include the AND circuit 110 and the feedback unit 112.

The load 300 is a three-phase electric motor driven by AC power supplied from the power conversion device 200. The load 300 is not limited to a specific application. The load 300 is an electric motor mounted on each of various electric devices and used as an electric motor, for example, for a hybrid vehicle, an electric vehicle, a railroad vehicle, an elevator, or an air conditioner.

The following is an explanation about the details of the power conversion device 200. The main conversion circuit 201 includes switching elements (not shown in the figures). By switching of the switching elements, the DC power supplied from the power supply 160 is converted into AC power and the AC power is supplied to the load 300. In the present embodiment, the switching elements included in the main conversion circuit 201 are RC-IGBT elements or BC-IGBTs. While the specific circuit configuration of the main conversion circuit 201 may be of various types, the main conversion circuit 201 according to the present embodiment is a three-phase full bridge circuit configured in two levels, and may be configured of six switching elements, namely, six RC-IGBT elements or six BC-IGBT elements. The semiconductor device according to any one of the above-mentioned first to third embodiments is applied to each switching element of the main conversion circuit 201. The six switching elements are configured such that each two switching elements are connected in series to form an upper arm and a lower arm. Each of the pairs of upper and lower arms forms a corresponding phase (a U-phase, a V-phase, and a W-phase) of the full bridge circuit. The output terminals of the upper and lower arms, that is, three output terminals of the main conversion circuit 201, are connected to the load 300.

The drive circuit 202 generates a drive signal for driving each switching element of the main conversion circuit 201 and supplies the drive signal to the control electrode of each switching element of the main conversion circuit 201. Specifically, according to the control signal from the control circuit 203 described below, the drive circuit 202 outputs the drive signal for turning on each switching element and the drive signal turning off each switching element to the control electrode of each switching element. When the switching element is maintained in an ON state, the drive signal is a voltage signal (an ON signal) equal to or greater than a threshold voltage of the switching element. When the switching element is maintained in an OFF state, the drive signal is a voltage signal (an OFF signal) equal to or less than the threshold voltage of the switching element.

The control circuit 203 controls each switching element of the main conversion circuit 201 so as to supply desired electric power to the load 300. Specifically, the time (ON time) in which each switching element of the main conversion circuit 201 is to be in an ON state is calculated based on the electric power to be supplied to the load 300. For example, the control circuit 203 can control the main conversion circuit 201 by PWM control for modulating the ON time of each switching element according to the voltage to be output. The control circuit 203 outputs a control command (control signal) to the drive circuit 202 such that an ON signal is output to the switching element that is to be in an ON state at each point of time and such that an OFF signal is output to the switching element that is to be in an OFF state at each point of time. According to this control signal, the drive circuit 202 outputs an ON signal or an OFF signal as a drive signal to the control electrode of each switching element.

In the power conversion device according to the present embodiment, since the main conversion circuit 201 includes the semiconductor device according to any one of the first to third embodiments as a switching element, reflux current can be accurately detected. Accordingly, a breakdown of the power conversion device due to excess current flowing through the switching elements is suppressed.

In a case where the power conversion device 200 includes the semiconductor device 1a as a switching element, the drive circuit 202 or the control circuit 203 or both, for example, protect the semiconductor device 1a from excess current based on current flowing through the electrode 22 or current flowing through the electrode 23 or both.

In a case where the power conversion device 200 includes the semiconductor device 1b as a switching element, the drive circuit 202 or the control circuit 203 or both, for example, protect the semiconductor device 1b from excess current based on current flowing through the electrode 22 or current flowing through the electrode 24 or both.

In a case where the power conversion device 200 includes the semiconductor device 1c as a switching element, the drive circuit 202 or the control circuit 203 or both, for example, protect the semiconductor device 1c from excess current based on the current flowing through the electrode 22.

In a case where the power conversion device 200 includes the semiconductor device 1d as a switching element, the drive circuit 202 or the control circuit 203 or both, for example, protect the semiconductor device 1d from excess current based on the current flowing through the electrode 22 or the current flowing through the electrode 24 or both.

In a case where the power conversion device 200 includes the semiconductor device 1a, the semiconductor device 1b, or the semiconductor device 1d as a switching element, for example, the power conversion device 200 includes a resistor provided as follows: current through the electrode 22 and current through the electrode 23 or the electrode 24 both flow through the resistor, as in the case of the sense resistor 111 in the feedback circuit 150 shown in FIG. 4. The drive circuit 202 or the control circuit 203 or both protect the semiconductor device 1a, the semiconductor device 1b, or the semiconductor device 1d depending on electric potential difference between both the ends of the resistor. By using the single resistor to detect current in both directions flowing through the semiconductor device 1a, the semiconductor device 1b, or the semiconductor device 1d, the configuration is simplified, and manufacturing costs are reduced.

The present embodiment has been described with reference to the example in which the semiconductor device according to any one of the first to third embodiments is applied to a three-phase inverter configured in two levels, but application of the semiconductor device according to any one of the first to third embodiments is not limited thereto, and the semiconductor device according to any one of the first to third embodiments is applicable to various types of power conversion devices. In the present embodiment, the power conversion device is configured in two levels, but the power conversion device may be configured in three levels or in a multilevel. When electric power is supplied to a single-phase load, the semiconductor device according to any one of the first to third embodiments may be applied to a single-phase inverter. Also, when electric power is supplied to a DC load or the like, the semiconductor device according to any one of the first to third embodiments may also be applicable to a DC/DC converter or an AC/DC converter.

Further, the power conversion device to which the semiconductor device according to any one of the first to third embodiments is applied is not limited to the case where the above-mentioned load is an electric motor, but may also be used as a power supply device for an electrical discharge machine, a laser beam machine, an induction heating cooking machine, or a contactless power feeding system, or may also be used as a power conditioner for a solar power generation system, a power storage system or the like.

Note that each embodiment can be freely combined, and each embodiment can be modified or omitted as appropriate.

While the disclosure has been shown and described in detail, the foregoing description is in all aspects illustrative and not restrictive. It is therefore understood that numerous modifications and variations can be devised.

What is claimed is:

1. A semiconductor device comprising a transistor and a diode both formed in a common semiconductor base body, comprising:
   a first electrode;
   a second electrode;
   a third electrode for current sensing;
   a fourth electrode for current sensing; and
   at least one first gate electrode, wherein the semiconductor base body includes:
a first main surface and a second main surface as one main surface and the other main surface, respectively;
a transistor region in which the transistor is formed;
a diode region in which the diode is formed; and
a separation region formed between the transistor region and the diode region,
wherein the transistor region includes:
a first semiconductor layer of a first conductivity type;
an eighth semiconductor layer of the first conductivity type provided on the second main surface side of the first semiconductor layer and having a first conductivity type impurity concentration higher than that of the first semiconductor layer;
a second semiconductor layer of a second conductivity type provided on the second main surface side of the eighth semiconductor layer;
a third semiconductor layer of the second conductivity type provided on the first main surface side of the first semiconductor layer; and
at least one fourth semiconductor layer selectively provided on the first main surface side of the third semiconductor layer,
wherein the diode region includes:
the first semiconductor layer;
the eighth semiconductor layer provided on the second main surface side of the first semiconductor layer;
a fifth semiconductor layer of the first conductivity type having a first conductivity type impurity concentration higher than that of the first semiconductor layer and provided on the second main surface side of the eighth semiconductor layer; and
a sixth semiconductor layer of the second conductivity type provided on the first main surface side of the first semiconductor layer,
wherein the first electrode is provided on the first main surface in the transistor region and in the diode region,
wherein the second electrode is provided on the second main surface in the transistor region and in the diode region,
wherein the third electrode is provided on the first main surface in the transistor region of the semiconductor base body at a distance from the first electrode,
wherein the fourth electrode is provided on the first main surface in the diode region of the semiconductor base body at a distance from the first electrode,
wherein the third semiconductor layer and the at least one fourth semiconductor layer are electrically connected to the first electrode in the first main surface in the transistor region,
wherein the third semiconductor layer and the at least one fourth semiconductor layer are electrically connected to the third electrode in the first main surface in the transistor region,
wherein the second semiconductor layer is electrically connected to the second electrode in the second main surface in the transistor region,
wherein the at least one first gate electrode faces the first semiconductor layer, the third semiconductor layer, and the at least one fourth semiconductor layer via at least one first insulating film in the transistor region,
wherein the sixth semiconductor layer is electrically connected to the first electrode in the first main surface in the diode region,
wherein the sixth semiconductor layer is connected to the fourth electrode in the first main surface in the diode region, and
wherein the fifth semiconductor layer is connected to the second electrode in the second main surface in the diode region.

2. The semiconductor device according to claim 1, wherein of ratios of current $I_1$ flowing through the first electrode to current $I_2$ flowing through the third electrode, namely $I_1/I_2$, and current $I_3$ flowing through the first electrode to current $I_4$ flowing through the fourth electrode, namely $I_3/I_4$, larger one is less than or equal to 1.2 times the smaller one, with the $I_1$ and the $I_2$ being current when an ON voltage is applied to the at least one first gate electrode and a same voltage which is positive when the first conductivity type is p type and is negative when the first conductivity type is n type with respect to the second electrode is applied to the first electrode and the third electrode, and with the $I_3$ and the $I_4$ being current when a same voltage which is negative when the first conductivity type is p type and is positive when the first conductivity type is n type with respect to the second electrode is applied to the first electrode and the fourth electrode.

3. The semiconductor device according to claim 1, wherein a border between the second semiconductor layer and the fifth semiconductor layer is at least partially included in the separation region in plan view.

4. The semiconductor device according to claim 1, wherein the fifth semiconductor layer and the eighth semiconductor layer are integrally formed.

5. A power conversion device comprising:
a main conversion circuit having the semiconductor device according to claim 1;
a drive circuit which outputs a drive signal for driving the semiconductor device; and
a control circuit which outputs a control signal for controlling the drive circuit to the drive circuit,
wherein the main conversion circuit converts power input to the main conversion circuit and outputs the converted power.

6. The power conversion device according to claim 5, wherein the drive circuit or the control circuit or both protect the semiconductor device from an excess current based on current flowing through the third electrode or current flowing through the fourth electrode or both.

7. The power conversion device according to claim 5, further comprising a resistor,
wherein the resistor is provided such that current flowing through the third electrode flows through the resistor,
wherein the resistor is provided such that current flowing through the fourth electrode flows through the resistor, and
wherein the drive circuit or the control circuit or both protect the semiconductor device from an excess current based on an electric potential difference between both ends of the resistor.

8. A semiconductor device comprising a transistor and a diode both formed in a common semiconductor base body, comprising:
a first electrode;
a second electrode;
a third electrode for current sensing;
a fourth electrode for current sensing; and
at least one first gate electrode,
wherein the semiconductor base body includes:
a first main surface and a second main surface as one main surface and the other main surface, respectively;
a transistor region in which the transistor is formed;

a diode region in which the diode is formed; and
a separation region formed between the transistor region and the diode region,
wherein the transistor region includes:
a first semiconductor layer of a first conductivity type;
an eighth semiconductor layer of the first conductivity type provided on the second main surface side of the first semiconductor layer and having a first conductivity type impurity concentration higher than that of the first semiconductor layer;
a second semiconductor layer of a second conductivity type provided on the second main surface side of the eighth semiconductor layer;
a third semiconductor layer of the second conductivity type provided on the first main surface side of the first semiconductor layer; and
at least one fourth semiconductor layer selectively provided on the first main surface side of the third semiconductor layer,
wherein the diode region includes:
the first semiconductor layer;
the eighth semiconductor layer provided on the second main surface side of the first semiconductor layer;
a fifth semiconductor layer of the first conductivity type having a first conductivity type impurity concentration higher than that of the first semiconductor layer and provided on the second main surface side of the eighth semiconductor layer; and
a sixth semiconductor layer of the second conductivity type provided on the first main surface side of the first semiconductor layer,
wherein the first electrode is provided on the first main surface in the transistor region and in the diode region,
wherein the second electrode is provided on the second main surface in the transistor region and in the diode region,
wherein the third electrode is provided on the first main surface in the transistor region of the semiconductor base body at a distance from the first electrode,
wherein the fourth electrode is provided on the second main surface in the diode region of the semiconductor base body at a distance from the second electrode,
wherein the third semiconductor layer and the at least one fourth semiconductor layer are electrically connected to the first electrode in the first main surface in the transistor region,
wherein the third semiconductor layer and the at least one fourth semiconductor layer are electrically connected to the third electrode in the first main surface in the transistor region,
wherein the second semiconductor layer is electrically connected to the second electrode in the second main surface in the transistor region,
wherein the at least one first gate electrode faces the first semiconductor layer, the third semiconductor layer, and the at least one semiconductor layer via at least one first insulating film in the transistor region,
wherein the sixth semiconductor layer is electrically connected to the first electrode in the first main surface in the diode region,
wherein the fifth semiconductor layer is connected to the fourth electrode in the second main surface in the diode region, and
wherein the fifth semiconductor layer is connected to the second electrode in the second main surface in the diode region.

9. The semiconductor device according to claim 8,
wherein of ratios of current $I_5$ flowing through the first electrode to current $I_6$ flowing through the third electrode, namely $I_5/I_6$, and current $I_7$ flowing through the second electrode to current $I_8$ flowing through the fourth electrode, namely $I_7/I_8$, larger one is less than or equal to 1.2 times the smaller one, with the $I_5$ and the $I_6$ being a current when an ON voltage is applied to the at least one first gate electrode and a same voltage which is positive when the first conductivity type is p type and is negative when the first conductivity type is n type with respect to the second electrode is applied to the first electrode and the third electrode, and with the $I_7$ and the $I_8$ being a current when a same voltage which is positive when the first conductivity type is p type and is negative when the first conductivity type is n type with respect to the first electrode is applied to the second electrode and the fourth electrode.

10. The semiconductor device according to claim 8,
wherein a border between the second semiconductor layer and the fifth semiconductor layer is at least partially included in the separation region in plan view.

11. The semiconductor device according to claim 8,
wherein the fifth semiconductor layer and the eighth semiconductor layer are integrally formed.

12. A power conversion device comprising:
a main conversion circuit having the semiconductor device according to claim 8;
a drive circuit which outputs a drive signal for driving the semiconductor device; and
a control circuit which outputs a control signal for controlling the drive circuit to the drive circuit,
wherein the main conversion circuit converts power input to the main conversion circuit and outputs the converted power.

13. The power conversion device according to claim 12,
wherein the drive circuit or the control circuit or both protect the semiconductor device from an excess current based on current flowing through the third electrode or current flowing through the fourth electrode or both.

14. The power conversion device according to claim 12,
further comprising a resistor,
wherein the resistor is provided such that current flowing through the third electrode flows through the resistor,
wherein the resistor is provided such that current flowing through the fourth electrode flows through the resistor, and
wherein the drive circuit or the control circuit or both protect the semiconductor device from an excess current based on an electric potential difference between both ends of the resistor.

15. A semiconductor device comprising a transistor formed in a semiconductor base body, comprising:
a first electrode;
a second electrode;
a third electrode for current sensing;
at least one first gate electrode; and
at least one second gate electrode,
wherein the semiconductor base body includes a first main surface and a second main surface as one main surface and the other main surface, respectively,
wherein the semiconductor base body includes:
a first semiconductor layer of a first conductivity type;
an eighth semiconductor layer of the first conductivity type provided on the second main surface side of the first semiconductor layer and having a first conductivity type impurity concentration higher than that of the first semiconductor layer;
a second semiconductor layer of a second conductivity type provided on the second main surface side of the eighth semiconductor layer;
at least one seventh semiconductor layer of the first conductivity type selectively provided on the second main surface side of the second semiconductor layer;
a third semiconductor layer of the second conductivity type provided on the first main surface side of the first semiconductor layer; and
at least one fourth semiconductor layer selectively provided on the first main surface side of the third semiconductor layer,
wherein the first electrode is provided on the first main surface of the semiconductor base body,
wherein the second electrode is provided on the second main surface of the semiconductor base body,
wherein the third electrode is provided on the first main surface of the semiconductor base body at a distance from the first electrode,
wherein the third semiconductor layer and the at least one fourth semiconductor layer are electrically connected to the first electrode in the first main surface,
wherein the third semiconductor layer and the at least one fourth semiconductor layer are electrically connected to the third electrode in the first main surface,
wherein the second semiconductor layer and the at least one seventh semiconductor layer are electrically connected to the second electrode in the second main surface,
wherein the at least one first gate electrode faces the first semiconductor layer, the third semiconductor layer, and the at least one fourth semiconductor layer via at least one first insulating film, and
wherein the at least one second gate electrode faces the first semiconductor layer, the second semiconductor layer, the at least one seventh semiconductor layer and the eighth semiconductor layer via at least one second insulating film.

16. The semiconductor device according to claim 15, wherein of ratios of current $I_9$ flowing through the first electrode to current $I_{10}$ flowing through the third electrode, namely $I_9/I_{10}$, and current $I_1$ flowing through the first electrode to current $I_{12}$ flowing through the third electrode, namely $_1/I_{12}$, larger one is less than or equal to 1.2 times the smaller one, with the $I_9$ and the $I_{10}$ being a current when a same voltage which is positive when the first conductivity type is p type and is negative when the first conductivity type is n type with respect to the second electrode is applied to the first electrode and the third electrode, and with the $I_{11}$ and the $I_{12}$ being a current when a same voltage which is negative when the first conductivity type is p type and is positive when the first conductivity type is n type with respect to the second electrode is applied to the first electrode and the third electrode.

17. The semiconductor device according to claim 16, wherein the at least one first gate electrode is provided in at least one first trench via the at least one first insulating film, the at least one first trench which is provided on the first main surface of the semiconductor base body and which extend in a first direction of in-plane directions,
wherein the at least one second gate electrode is provided in at least one second trench via the at least one second insulating film, the at least one second trench which is provided on the second main surface of the semiconductor base body and extend in a second direction of in-plane directions,
wherein the at least one fourth semiconductor layer is in contact with the at least one first trench in the first main surface,
wherein the at least one seventh semiconductor layer is in contact with the at least one second trench in the second main surface, and
wherein a ratio of W1 to W2, namely W1/W2, and a ratio of W3 to W4, namely W3/W4, are different, with the W1 being a sum of length in the first direction in which the at least one fourth semiconductor layer is in contact with the at least one first trench in the first main surface in the region overlapping in plan view with the region where the first electrode is provided on the first main surface, and with the W2 being a sum of length in the first direction in which the at least one fourth semiconductor layer is in contact with the at least one first trench in the first main surface in the region overlapping in plan view with the region where the third electrode is provided on the first main surface, and with the W3 being a sum of length in the second direction in which the at least one seventh semiconductor layer is in contact with the at least one second trench in the second main surface in the region overlapping in plan view with the region where the first electrode is provided on the first main surface, and with the W4 being a sum of length in the second direction in which the at least one seventh semiconductor layer is in contact with the at least one second trench in the second main surface in the region overlapping in plan view with the region where the third electrode is provided on the first main surface.

18. A power conversion device comprising:
a main conversion circuit having the semiconductor device according to claim 15;
a drive circuit which outputs a drive signal for driving the semiconductor device; and
a control circuit which outputs a control signal for controlling the drive circuit to the drive circuit,
wherein the main conversion circuit converts power input to the main conversion circuit and outputs the converted power.

19. The power conversion device according to claim 18, wherein the drive circuit or the control circuit or both protect the semiconductor device from an excess current based on current flowing through the third electrode.

20. A semiconductor device comprising a transistor formed in a semiconductor base body, comprising:
a first electrode;
a second electrode;
a third electrode for current sensing;
a fourth electrode for current sensing;
at least one first gate electrode; and
at least one second gate electrode,
wherein the semiconductor base body includes a first main surface and a second main surface as one main surface and the other main surface, respectively,
wherein the semiconductor base body includes:
a first semiconductor layer of a first conductivity type;
an eighth semiconductor layer of the first conductivity type provided on the second main surface side of the first semiconductor layer and having a first conductivity type impurity concentration higher than that of the first semiconductor layer;

a second semiconductor layer of a second conductivity type provided on the second main surface side of the eighth semiconductor layer;

at least one seventh semiconductor layer of the first conductivity type selectively provided on the second main surface side of the second semiconductor layer;

a third semiconductor layer of the second conductivity type provided on the first main surface side of the first semiconductor layer; and at least one fourth semiconductor layer selectively provided on the first main surface side of the third semiconductor layer, wherein the first electrode is provided on the first main surface of the semiconductor base body, wherein the second electrode is provided on the second main surface of the semiconductor base body, wherein the third electrode is provided on the first main surface of the semiconductor base body at a distance from the first electrode, wherein the fourth electrode is provided on the second main surface of the semiconductor base body at a distance from the second electrode, wherein the third semiconductor layer and the at least one fourth semiconductor layer are electrically connected to the first electrode in the first main surface, wherein the third semiconductor layer and the at least one fourth semiconductor layer are electrically connected to the third electrode in the first main surface, wherein the second semiconductor layer and the at least one seventh semiconductor layer are electrically connected to the second electrode in the second main surface, wherein the second semiconductor layer and the at least one seventh semiconductor layer are electrically connected to the fourth electrode in the second main surface, wherein the at least one first gate electrode faces the first semiconductor layer, the third semiconductor layer, and the at least one fourth semiconductor layer via at least one first insulating film, and wherein the at least one second gate electrode faces the first semiconductor layer, the second semiconductor layer, the at least one seventh semiconductor layer and the eighth semiconductor layer via at least one second insulating film.

21. The semiconductor device according to claim 20, wherein of ratios of current $I_{13}$ flowing through the first electrode to current $I_{14}$ flowing through the third electrode, namely $I_{13}/I_{14}$, and current $I_{15}$ flowing through the second electrode to current $I_{16}$ flowing through the fourth electrode, namely $I_{15}/I_{16}$, larger one is less than or equal to 1.2 times the smaller one, with the $I_{13}$ and the $I_{14}$ being current when an ON voltage is applied to the at least one first gate electrode and a same voltage which is positive when the first conductivity type is p type and is negative when the first conductivity type is n type with respect to the second electrode is applied to the first electrode and the third electrode, and with the $I_{15}$ and the $I_{16}$ being current when an ON voltage is applied to the at least one second gate electrode and a same voltage which is positive when the first conductivity type is p type and is negative when the first conductivity type is n type with respect to the first electrode is applied to the second electrode and the fourth electrode.

22. The semiconductor device according to claim 21, wherein the at least one first gate electrode is provided in at least one first trench via the at least one first insulating film, the at least one first trench which is provided on the first main surface of the semiconductor base body and which extend in a first direction of in-plane directions, wherein at least one second gate electrode is provided in at least one second trench via the at least one second insulating film, the at least one second trench which is provided on the second main surface of the semiconductor base body and which extend in a second direction of in-plane directions, wherein the at least one fourth semiconductor layer is in contact with the at least one first trench, wherein the at least one seven semiconductor layer is in contact with the at least one second trench, and wherein a ratio of W5 to W6, namely W5/W6, and a ratio of W7 to W8, namely W7/W8, are different, with the W5 being a sum of length in the first direction in which the at least one fourth semiconductor layer is in contact with the at least one first trench in the first main surface in the region overlapping in plan view with the region where the first electrode is provided on the first main surface, and with the W6 being a sum of length in the first direction in which the at least one fourth semiconductor layer is in contact with the at least one first trench in the first main surface in the region overlapping in plan view with the region where the third electrode is provided on the first main surface, and with the W7 being a sum of length in the second direction in which the at least one seventh semiconductor layer is in contact with the at least one second trench in the second main surface in the region overlapping in plan view with the region where the second electrode is provided on the second main surface, and with the W8 being a sum of length in the second direction in which the at least one seventh semiconductor layer is in contact with the at least one second trench in the second main surface in the region overlapping in plan view with the region where the fourth electrode is provided on the second main surface.

23. The semiconductor device according to claim 21, wherein an area of the third electrode in plan view and an area of the fourth electrode in plan view are different.

24. A power conversion device comprising:

a main conversion circuit having the semiconductor device according to claim 20;

a drive circuit which outputs a drive signal for driving the semiconductor device; and a control circuit which outputs a control signal for controlling the drive circuit to the drive circuit, wherein the main conversion circuit converts power input to the main conversion circuit and outputs the converted power.

25. The power conversion device according to claim 24, wherein the drive circuit or the control circuit or both protect the semiconductor device from an excess current based on current flowing through the third electrode or current flowing through the fourth electrode or both.

26. The power conversion device according to claim 24, further comprising a resistor, wherein the resistor is provided such that current flowing through the third electrode flows through the resistor, wherein the resistor is provided such that current flowing through the fourth electrode flows through the resistor, and wherein the drive circuit or the control circuit or both protect the semiconductor device from an excess current based on an electric potential difference between both ends of the resistor.

* * * * *